United States Patent
Yoshida et al.

(10) Patent No.: US 10,749,026 B2
(45) Date of Patent: Aug. 18, 2020

(54) SEMICONDUCTOR DEVICE AND METHOD OF MANUFACTURING THE SEMICONDUCTOR DEVICE

(71) Applicant: Renesas Electronics Corporation, Tokyo (JP)

(72) Inventors: Yoshinori Yoshida, Tokyo (JP); Tsuyoshi Kachi, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/116,598

(22) Filed: Aug. 29, 2018

(65) Prior Publication Data
US 2019/0131448 A1    May 2, 2019

(30) Foreign Application Priority Data

Oct. 30, 2017    (JP) ................................ 2017-209307

(51) Int. Cl.
*H01L 29/78*    (2006.01)
*H01L 29/08*    (2006.01)
(Continued)

(52) U.S. Cl.
CPC ........ *H01L 29/7813* (2013.01); *H01L 27/088* (2013.01); *H01L 29/0615* (2013.01); *H01L 29/0634* (2013.01); *H01L 29/0865* (2013.01); *H01L 29/0882* (2013.01); *H01L 29/4236* (2013.01); *H01L 29/4238* (2013.01); *H01L 29/66734* (2013.01); *H01L 29/7803* (2013.01);
(Continued)

(58) Field of Classification Search
None
See application file for complete search history.

(56) References Cited

U.S. PATENT DOCUMENTS 3,653,120 A *   4/1972  Sirrine ................. H01L 21/743
                                                      438/354
7,335,946 B1    2/2008  Bhalla et al.
(Continued)

FOREIGN PATENT DOCUMENTS

JP    2017-045827 A    3/2017
JP    2017-143188 A    8/2017

OTHER PUBLICATIONS

Extended European Search Report dated Apr. 12, 2019 for European Patent Application No. 18191750.1-1212.

*Primary Examiner* — Anthony Ho
*Assistant Examiner* — Kevin Quinto
(74) *Attorney, Agent, or Firm* — McDermott Will & Emery LLP

(57) ABSTRACT

Provided are a semiconductor device including a desired snubber part in accordance with use of the semiconductor device and a method of manufacturing the semiconductor device. A snubber region having a snubber part is defined in a gate pad region defined on a side close to a first main surface of a semiconductor substrate. A p-type diffusion layer and an n-type column layer contacted to each other are formed in the snubber region. The p-type diffusion layer and the n-type column layer are formed as a parasitic capacitance of the snubber part while the n-type column layer is electrically coupled to a drain. The p-type diffusion layer, which extends in a Y-axis direction, is a resistance of the snubber part and electrically coupled to a source.

20 Claims, 32 Drawing Sheets

(51) Int. Cl.
  *H01L 27/088* (2006.01)
  *H01L 29/423* (2006.01)
  *H01L 29/66* (2006.01)
  *H01L 29/06* (2006.01)

(52) U.S. Cl.
  CPC ...... *H01L 29/7811* (2013.01); *H01L 29/0653* (2013.01)

(56) References Cited

U.S. PATENT DOCUMENTS

| | | |
|---|---|---|
| 9,660,071 B2 | 5/2017 | Katou et al. |
| 2006/0151831 A1 | 7/2006 | Ninomiya et al. |
| 2016/0104773 A1* | 4/2016 | Kelkar ............... H01L 29/407 257/334 |
| 2017/0229572 A1 | 8/2017 | Nagase et al. |

* cited by examiner

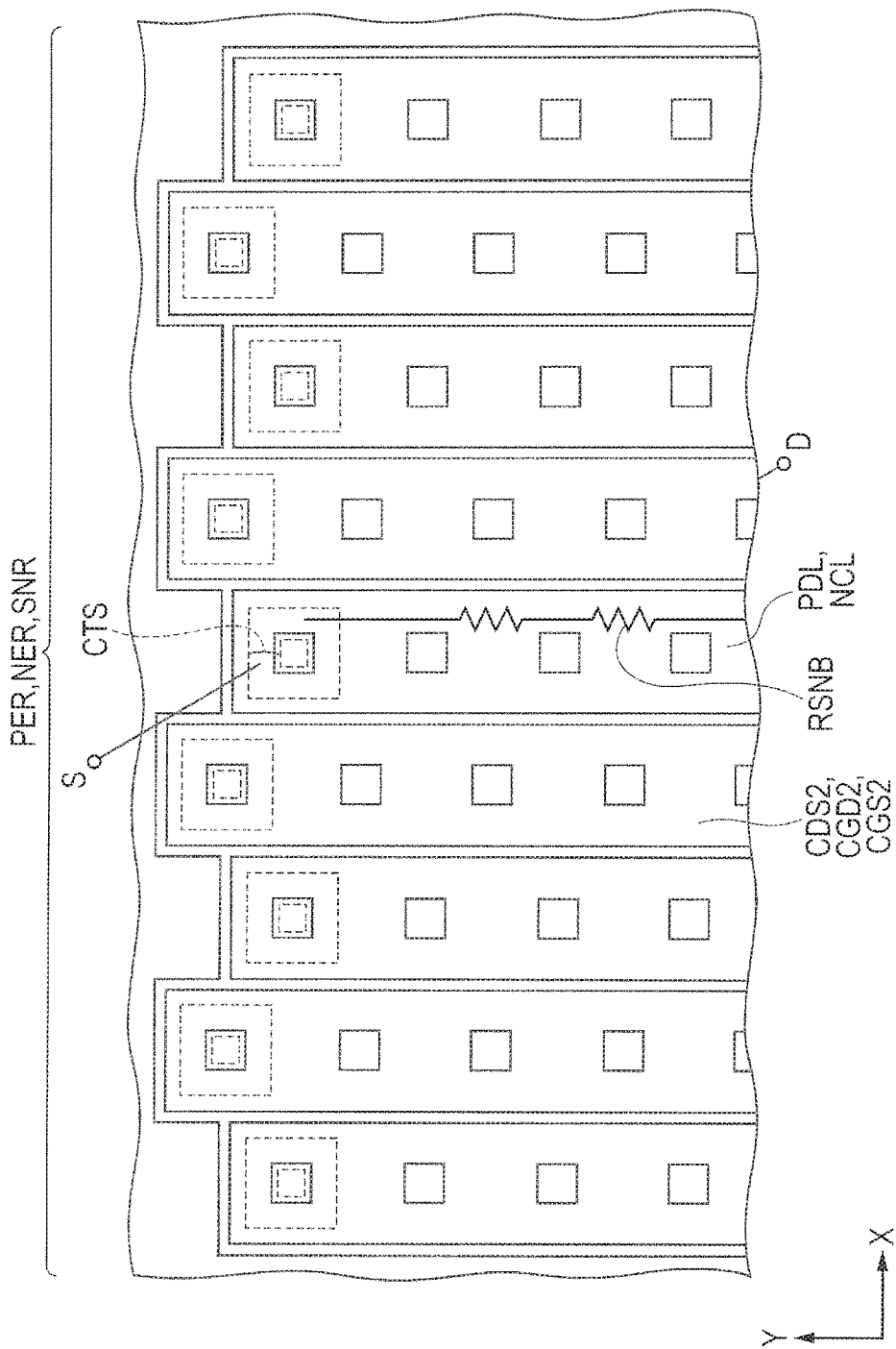

SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2017-209307 filed on Oct. 30, 2017 including the specification, drawings and abstract is incorporated herein by reference in its entirety.

BACKGROUND

The present invention relates to a semiconductor device and a method of manufacturing the semiconductor device. For example, the semiconductor device can be preferably used for a semiconductor device having a trench-gate power MOSFET.

A semiconductor device having an insulated gate field effect transistor such as a trench-gate power metal oxide semiconductor field effect transistor (MOSFET) is known as a semiconductor device performing power switching.

In this type of semiconductor device, when a parasitic diode in the insulated gate field effect transistor performs a recovery operation, a serge voltage may be generated between a source electrode and a drain electrode due to a parasitic inductance in a circuit of the semiconductor device. When the insulated gate field effect transistor is switched from on to off, the serge voltage may also be generated between the source electrode and the drain electrode due to the parasitic inductance. The serge voltage may cause breakage of the insulated gate field effect transistor or another semiconductor device.

The semiconductor device has a snubber circuit to reduce such a surge voltage. The snubber circuit is configured of a snubber part including a resistance and a capacitance coupled in series. The resistance and the capacitance coupled in series are electrically coupled in parallel between the drain electrode and the source electrode of the insulated gate field effect transistor. Examples of a document that discloses the semiconductor device having the snubber part include Japanese Unexamined Patent Application Publications No. 2017-45827 and No. 2017-143188.

In the Japanese Unexamined Patent Application Publication No. 2017-45827, the snubber part is formed directly below a region where a gate electrode of the insulated gate field effect transistor is disposed. In the Japanese Unexamined Patent Application Publication No. 2017-143188, the snubber part including a resistance, a capacitance, and a snubber electrode is formed in a snubber region defined in a semiconductor substrate.

SUMMARY

A semiconductor device including the insulated gate field effect transistor requires to have a desired snubber part in accordance with use of the semiconductor device in order to securely reduce the surge voltage.

Other objects and novel features will be clarified from the description of this specification and the accompanying drawings.

A semiconductor device of one embodiment includes a semiconductor substrate, a first region, a second region, a first diffusion layer of a first conductivity type and a second diffusion layer of a second conductivity type contacted to each other, an insulated gate field effect transistor, and a snubber part having a resistance and a capacitance. The first diffusion layer is located on a basal substrate side and electrically coupled to the basal substrate. The second diffusion layer is located on a first main surface side. In the second region, the first diffusion layer and the second diffusion layer act as the capacitance, while the first diffusion layer is electrically coupled to the drain of the insulated gate field effect transistor. The second diffusion layer is electrically coupled as the resistance to the source of the insulated gate field effect transistor. The second diffusion layer is formed so as to extend in a first direction from a contact at which the second diffusion layer is electrically coupled to the source.

A method of manufacturing a semiconductor device according to another embodiment includes the following steps. Provided is a semiconductor substrate having a first main surface and a second main surface opposed to each other, and having a basal substrate of a first conductivity type on a second main surface side. A first region is defined, and a second region is defined in a region other than the first region on a first main surface side of the semiconductor substrate. An element is formed through a step including formation of an insulated gate field effect transistor in the first region, and formation of a snubber part having a resistance and a capacitance in the second region. The step of forming the element includes the following steps. A first diffusion layer of the first conductivity type is formed so as to extend from the first main surface of the semiconductor substrate to a first depth while being electrically coupled to the basal substrate. A second diffusion layer of a second conductivity type is formed from the first main surface of the semiconductor substrate to a second depth shallower than the first depth so as to be a channel of the insulated gate field effect transistor in the first region, and be the resistance of the snubber part while being contacted to the first diffusion layer so as to be a capacitance in the second region. A source electrode is formed so as to be electrically coupled to the source of the insulated gate field effect transistor in the first region and electrically coupled to the second diffusion layer in the second region. The step of forming the element includes a step of forming the element such that the second diffusion layer extends in a first direction from a contact at which the second diffusion layer is electrically coupled to the source electrode.

According to the semiconductor device of one embodiment, a surge voltage can be reduced in accordance with use of the semiconductor device.

According to a method of manufacturing a semiconductor device of another embodiment, a semiconductor device can be manufactured such that a surge voltage can be reduced in accordance with use of the semiconductor device.

BRIEF DESCRIPTION OF THE DRAWINGS

FIG. 37 is a partial plan view illustrating an example of a planar pattern within a frame A7 shown in FIG. 36 in the seventh embodiment.

DETAILED DESCRIPTION

The following embodiments each describe a semiconductor device that includes an insulated gate field effect transistor having a trench gate electrode and includes a snubber part. First, the semiconductor device includes a semiconductor substrate having a region defined as cell region (first region), in which the insulated gate field effect transistor is disposed, and a region defined as a snubber region (second region), in which a snubber part is disposed. The snubber region is defined in a region, in which no insulated gate field effect transistor is disposed, other than the cell region. Hereinafter, a structure of the semiconductor device is described while the snubber part is specifically described.

First Embodiment

A first embodiment is described with a first example of a semiconductor device, in which the snubber region is defined in a gate pad region having a gate pad disposed therein.

Figure 1:
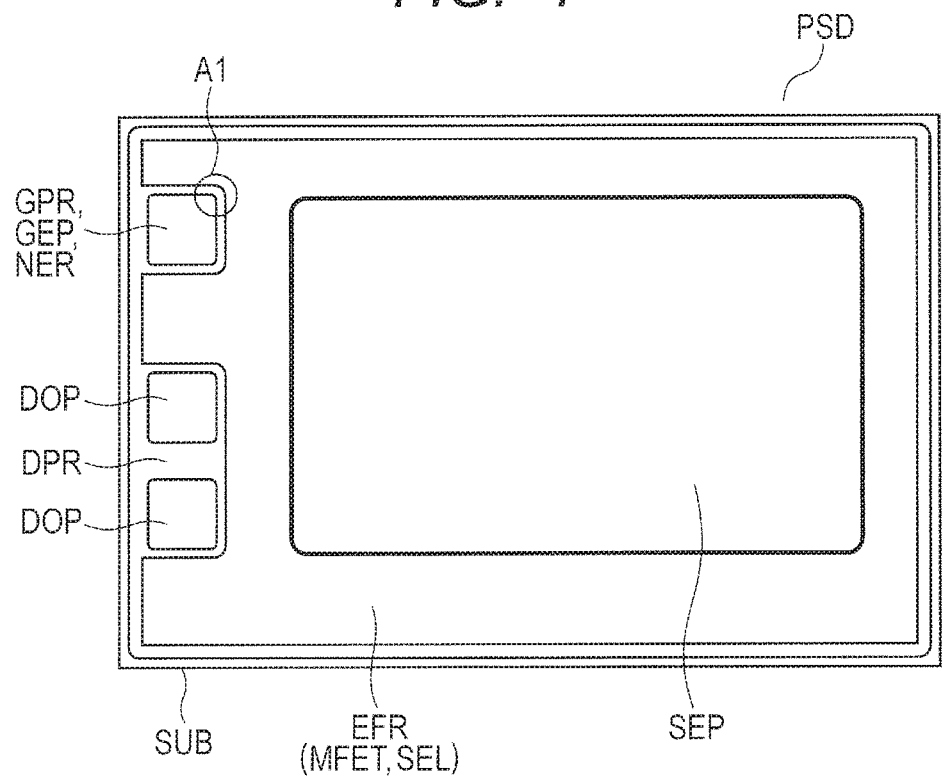
FIG. 1 is a plan view illustrating an example of a planar pattern of a semiconductor device in a chip form according to a first embodiment.

As shown in FIG. 1, a semiconductor device PSD (in a chip form) has, for example, a cell region EFR, a gate pad region GPR, and a diode pad region DPR, which are defined on a first main surface side of a semiconductor substrate SUB. An insulated gate field effect transistor MFET is formed in the cell region EFR.

A gate pad GEP is formed in the gate pad region GPR. The gate pad GEP is electrically coupled to a gate electrode of the insulated gate field effect transistor by an undepicted gate interconnection. The gate pad GEP is used for electrical coupling with an external component. Diode pads DOP are formed in the diode pad region DPR. For example, an undepicted temperature detecting diode is formed in the diode pad region DPR to detect temperature of the semiconductor device. The diode pads DOP are electrically coupled to the temperature detecting diode. The diode pads DOP are used for electrical coupling with an external component.

A source electrode SEL is formed so as to cover the cell region EFR. The source electrode SEL is electrically coupled to a source of the insulated gate field effect transistor MFET. An undepicted passivation film is formed so as to cover the source electrode SEL. The passivation film has an opening to expose the source electrode SEL, for example. The exposed source electrode SEL is used as a source pad SEP for electrical coupling with an external component.

A snubber region NER is defined in the gate pad region GPR. In the snubber region NER, a snubber part SNR (see FIG. 4) is formed by a p-type diffusion layer PDL to be a resistance, a p-type diffusion layer PDL and an n-type column layer NCL to be a capacitance are formed as a snubber part SNR (see FIG. 4).

The capacitance of the snubber part SNR means a capacitance when a reverse bias is applied to a drain, and a parasitic diode is given during forward bias. The capacitance of the snubber part SNR corresponds to a reverse bias (voltage). In this specification, the capacitance of the snubber part SNR is mentioned as capacitance for convenience of description. The capacitance and the resistance are electrically coupled in series. The capacitance and the resistance coupled in series are electrically coupled in parallel to the insulated gate field effect transistor MFET.

Figure 2:
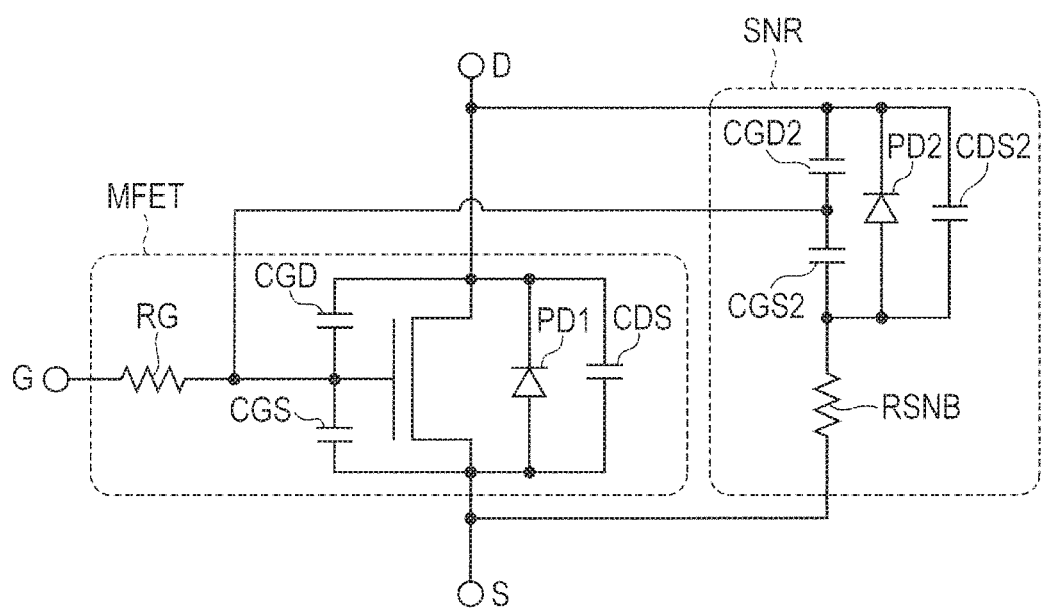
FIG. 2 is an equivalent circuit diagram of an insulated gate field effect transistor and a snubber part in the first embodiment.

Equivalent circuits of the snubber part and the insulated gate field effect transistor are now described. As shown in FIG. 2, the snubber part SNR is electrically coupled in parallel between a source S and a drain D of the insulated gate field effect transistor MFET. The insulated gate field effect transistor MFET has a capacitance CDS, a capacitance CGD, and capacitance CGS as parasitic capacitances, and has a diode PDI as a parasitic diode.

The capacitance CDS is a parasitic capacitance between the drain D and the source S. The capacitance CGD is a parasitic capacitance between the gate G and the drain D. The capacitance CGS is a parasitic capacitance between the gate G and the source S. The diode PDI is a parasitic diode between the source S and the drain D. The resistance RG is a resistance of the gate G.

The snubber part SNR has a resistance RSNB, a capacitance CDS2, a capacitance CGD2, and a capacitance CGS2. The capacitance CDS2 is a parasitic capacitance between the drain D and the source S, which occurs when a reverse bias is applied to the drain. When a forward bias is applied to the drain, a parasitic diode PD2 occurs. The capacitance CGD2 is a parasitic capacitance between the gate G and the drain D. The capacitance CGS2 is a parasitic capacitance between the gate G and the source S.

A structure of the snubber part SNR with its periphery is described with reference to FIGS. 3, 4, and 5. As a structure within a circular frame A1 shown in FIG. 1, FIG. 3 illustrates an example of a planar pattern, FIG. 4 illustrates an example of a perspective section view, and FIG. 5 illustrates an example of a section view.

Figure 3:
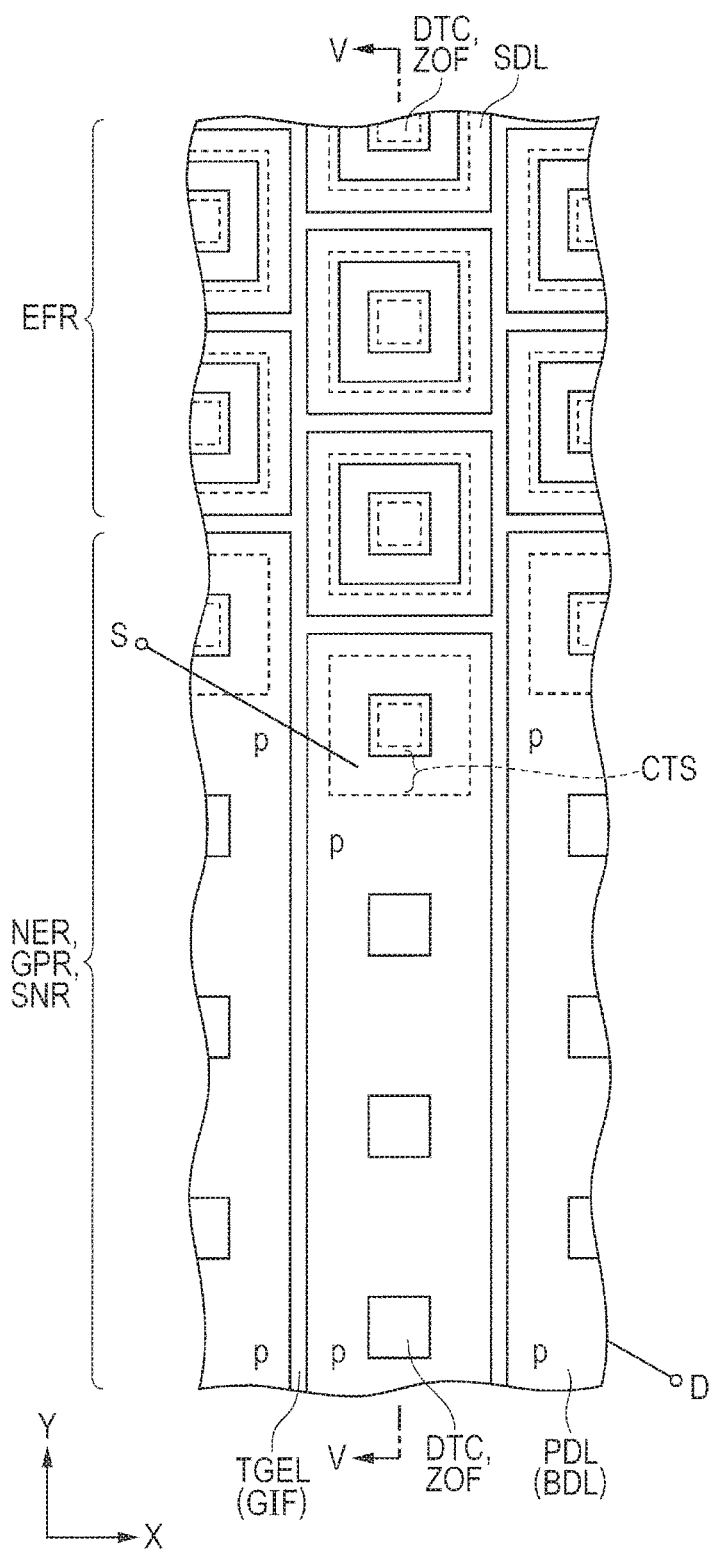
FIG. 3 is a partial plan view illustrating an example of a planar pattern within a frame A1 shown in FIG. 1 in the first embodiment.
Figure 4:
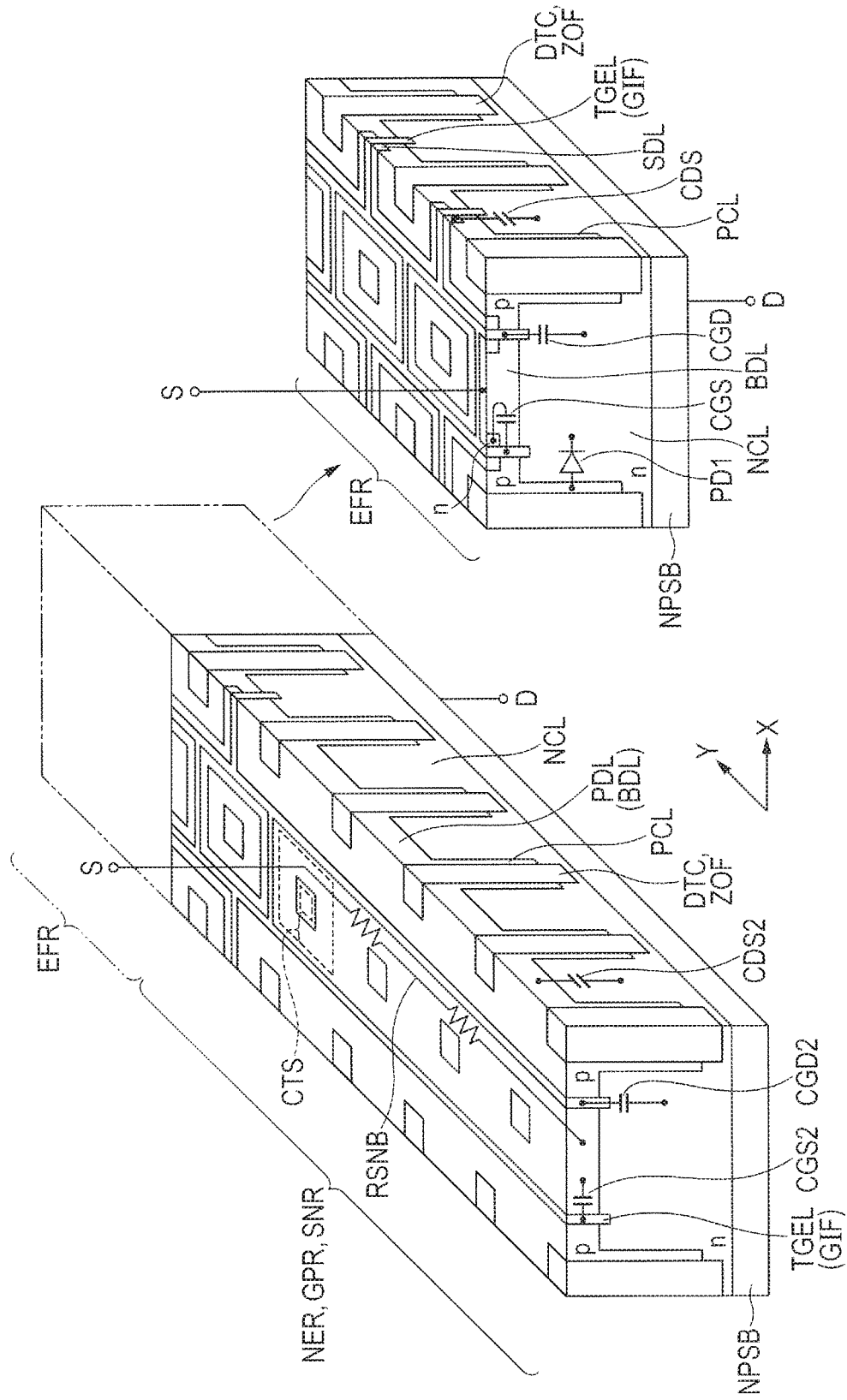
FIG. 4 is a perspective section view illustrating a structure within the frame A1 shown in FIG. 1 in the first embodiment.
Figure 5:
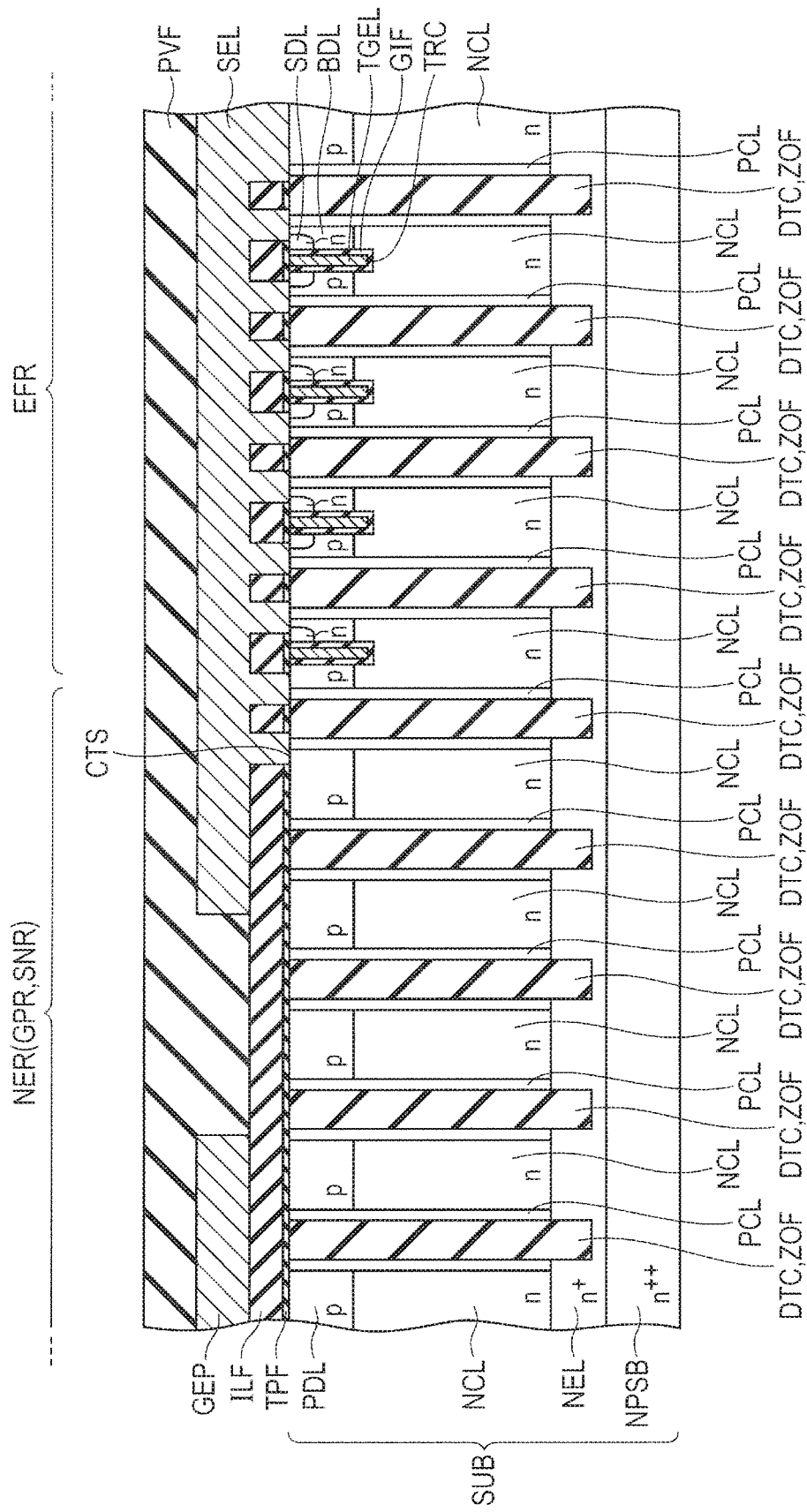
FIG. 5 is a sectional view along a sectional line V-V shown in FIG. 3 in the first embodiment.

As shown in FIGS. 3, 4, and 5, the snubber region NER and the cell region EFR are each defined on a first main surface side of the semiconductor substrate SUB. The snubber region NER is defined in the gate pad region GPR. An $n^{++}$-type substrate NPSB (n-type epitaxial layer NEL) is disposed on a second main surface side of the semiconductor substrate SUB. The $n^{++}$-type substrate NPSB is electrically coupled to an undepicted drain electrode.

In the cell region EFR, a base diffusion layer BDL is formed from the first main surface of the semiconductor substrate SUB to a predetermine depth (second depth). A channel of the insulated gate field effect transistor is formed in the base diffusion layer BDL. The n-type column layer NCL is formed so as to extend from the bottom of the base diffusion layer BDL to a predetermined depth (first depth) while being in contact with the nil-type substrate NPSB (n-type epitaxial layer NEL).

A trench gate electrode TGEL is formed so as to extend from the first main surface of the semiconductor substrate SUB to the n-type column layer NCL through the base diffusion layer BDL. The trench gate electrode TGEL is formed on the inside of a gate trench TRC with a gate insulating film GIF in between. The trench gate electrode TGEL is disposed in a mesh pattern.

An n-type source diffusion layer SDL is formed in the base diffusion layer BDL so as to extend over a region from the first main surface of the semiconductor substrate SUB to a depth shallower than the bottom of the base diffusion layer BDL. The source diffusion layer SDL is formed on a lateral side of the trench gate electrode TGEL with a gate insulating film GIF in between. A plurality of buried insulators ZOF are formed from the first main surface of the semiconductor substrate SUB toward the $n^{++}$-type substrate NPSB. Each buried insulator ZOF is formed in a deep trench DTC.

The buried insulators ZOF are disposed in islands at a distance from each other, for example. The buried insulators ZOF are formed in a region surrounded by the trench gate electrode TGEL disposed in the mesh pattern in planar view. A p-type column layer PCL is formed so as to be in contact with the buried insulators ZOF. The p-type column layer PCL is also in contact with the n-type column layer NCL. The p-type column layer PCL and the n-type column layer NCL are alternately disposed in a form of a super junction structure.

The source diffusion layer SDL and the n-type column layer NCL form a parasitic capacitance CDS. The trench gate electrode TGEL and the n-type column layer NCL form a parasitic capacitance CGD. The trench gate electrode TGEL and the source diffusion layer SDL form a parasitic capacitance CGS. The p-type column layer PCL and the n-type column layer NCL form a parasitic diode PD1.

In the snubber region NER, the p-type diffusion layer PDL is formed from the first main surface of the semiconductor substrate SUB to a predetermined depth (second depth). The n-type column layer NCL is formed from the bottom of the p-type diffusion layer PDL to a predetermined depth (first depth) while being in contact with the n-type epitaxial layer NEL (nil-type substrate NPSB).

Trench gate electrode TGEL are formed so as to extend from the first main surface of the semiconductor substrate SUB to the n-type column layer NCL through the p-type diffusion layer PDL. Each trench gate electrode TGEL is formed on the inside of the gate trench TRC with the gate insulating film GIF in between. The trench gate electrodes TGEL extend in a Y-axis direction, for example. The trench gate electrodes TGEL are formed in stripes at an interval from each other in an X-axis direction intersecting the Y axis.

The p-type diffusion layer PDL located between a first trench gate electrode TGEL and a second trench gate electrode TGEL adjacent to each other forms a resistance RSNB of the snubber part SNR. The resistance RSNB extends in the Y-axis direction, for example. Contacts CTS are provided at an end of the resistance RSNB on a side close to the cell region EFR so as to be electrically coupled to the source electrode SEL (source S). A resistance value of the resistance RSNB can be adjusted by a length of the p-type diffusion layer PDL starting from the contact CTS.

The n-type column layer NCL is located under the p-type diffusion layer PDL in a manner of being contacted thereto. The p-type diffusion layer PDL and the n-type column layer NCL form the parasitic capacitance CDS2. Capacitance of the capacitance CDS2 depends on a reverse bias (voltage) applied to the drain. In addition, for example, a dimension (for example, length in the X-axis direction, length in the Y-axis direction, and length in the Z-axis direction) of the p-type diffusion layer PDL (p-type column layer PCL) is used to vary a junction area between the p-type diffusion layer PDL and the n-type column layer NCL so that the capacitance of the capacitance CDS2 can be adjusted. As described later, the resistance value of the resistance RSNB and the capacitance of the capacitance CDS2 are important parameters to reduce a surge voltage.

A plurality of buried insulators ZOF are disposed in islands in the Y axis direction at a distance from each other in a region located between a first trench gate electrode TGEL and a second trench gate electrode TGEL adjacent to each other. The buried insulator ZOF is formed in the deep trench DTC so as to extend from the first main surface of the semiconductor substrate SUB to the n-type epitaxial layer NEL through the p-type diffusion layer PDL and the n-type column layer NCL. The p-type column layer PCL is formed so as to be in contact with each of the buried insulator ZOF and the n-type column layer NCL.

The trench gate electrode TGEL and the n-type column layer NCL form a parasitic capacitance CGD2. The trench gate electrode TGEL and the p-type diffusion layer PDL form a parasitic capacitance CGS2. The p-type diffusion layer PDL in the snubber region NER and the base diffusion layer BDL in the cell region FER are divided by the trench gate electrode TGEL extending in the Y-axis direction, for example.

A protective insulating film TPF and an interlayer insulating film ILF are formed so as to cover the cell region EFR and the snubber region NER. The source electrode SEL and the gate pad GEP are formed so as to cover the interlayer insulating film ILF. The source electrode SEL is electrically coupled to the source diffusion layer SDL and the base diffusion layer BDL in a contact manner.

The source electrode SEL is electrically coupled to the p-type diffusion layer PDL in a manner of being in contact therewith via the contact CTS. A passivation film PVF is formed so as to cover the source electrode SEL and the gate pad GEP. A major part of the semiconductor device is configured as described above.

An example of a method of manufacturing the semiconductor device is now described. First, the semiconductor substrate SUB (see FIG. 6) having the nil-type substrate NPSB, the n-type epitaxial layer NEL and the p-type epitaxial layer PEL is provided.

Subsequently, an undepicted gate trench is formed from the surface of the p-type epitaxial layer PEL to a predetermined depth on the first main surface side of the semiconductor substrate SUB. Subsequently, a thermal oxidation process is performed to form an undepicted silicon oxide film on the surface of the p-type epitaxial layer PEL including a part of the p-type epitaxial layer PEL, which is exposed in the gate trench. Subsequently, an undepicted polysilicon film is formed so as to fill the gate trench.

Figure 6:
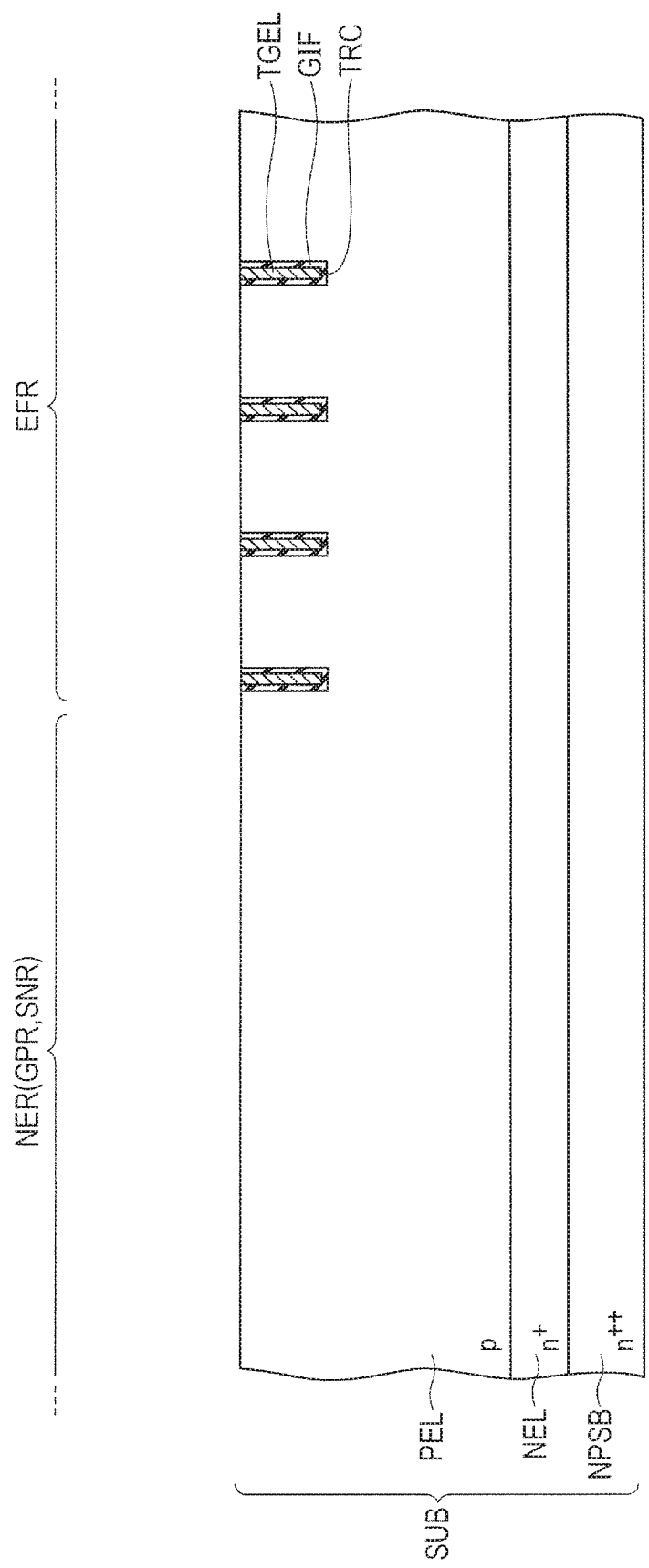
FIG. 6 is a sectional view illustrating one step of a method of manufacturing the semiconductor device in the first embodiment.

Subsequently, parts of the silicon oxide film and the polysilicon film, which are located on a top of the p-type epitaxial layer PEL, are removed. As a result, as shown in FIG. 6, a part of the silicon oxide film, which is left in the gate trench TRC, forms the gate insulating film GIF. A part of the polysilicon film, which is left in the gate trench TRC, forms the trench gate electrode TGEL. At this time, the trench gate electrodes TGEL are formed so as to extend, for example, in the Y-axis direction in the snubber region NER (see FIGS. 3 and 4).

Subsequently, a thermal oxidation process is performed to forma protective insulating film IPF (see FIG. 7) on a surface of the p-type epitaxial layer PEL. Subsequently, predetermined photoengraving processing and etching processing are performed to form the deep trenches DTC in each of the cell region EFR and the snubber region NER (see FIG. 7). The deep trenches DTC are formed in islands at a distance from each other.

Figure 7:
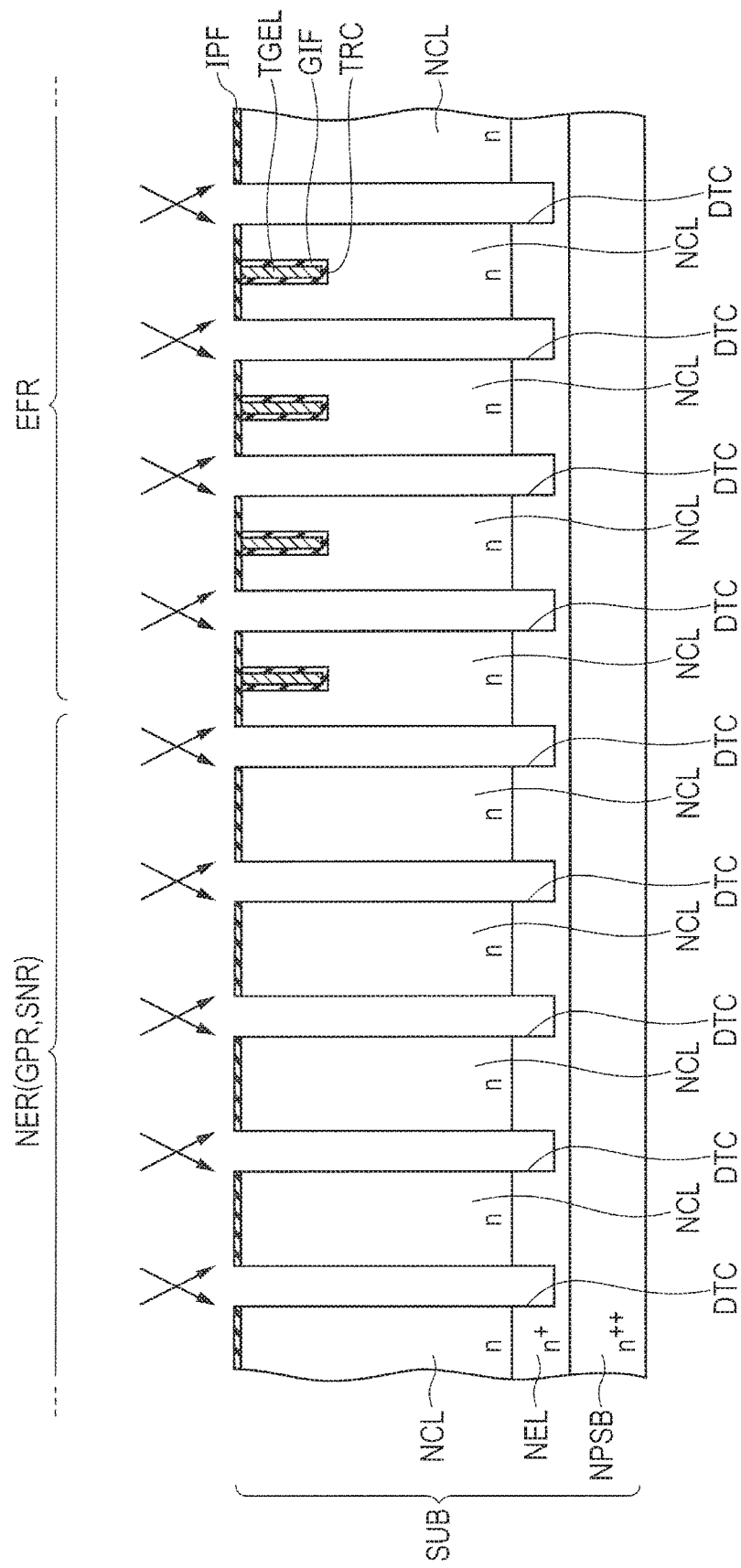
FIG. 7 is a sectional view illustrating a step after the step illustrated in FIG. 6 in the first embodiment.
Figure 8:
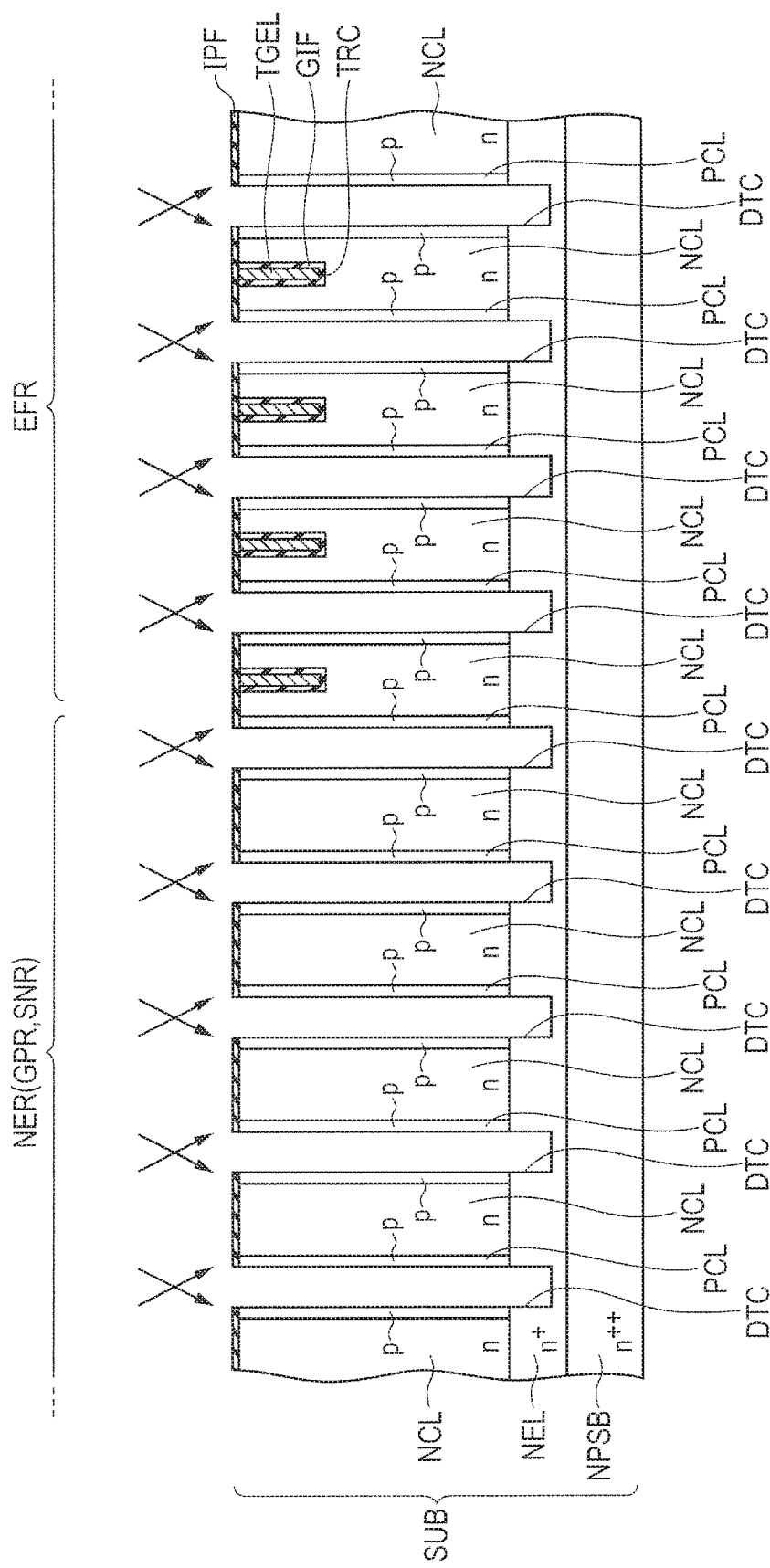
FIG. 8 is a sectional view illustrating a step after the step illustrated in FIG. 7 in the first embodiment.

Subsequently, as shown in FIG. 7, an n-type impurity is obliquely implanted through the protective insulating film IPF and the deep trenches DTC. Subsequently, heat treatment is performed to form the n-type column layer NCL in each of the cell region EFR and the snubber region NER. Subsequently, as shown in FIG. 8, a p-type impurity is implanted through the protective insulating film IPF and the deep trenches DTC. Subsequently, heat treatment is performed to form the p-type column layer PCL along a sidewall surfaces of the deep trenches DTC in each of the cell region EFR and the snubber region NER. Consequently, the p-type column layer PCL is in contact with the n-type column layer NCL.

Figure 9:
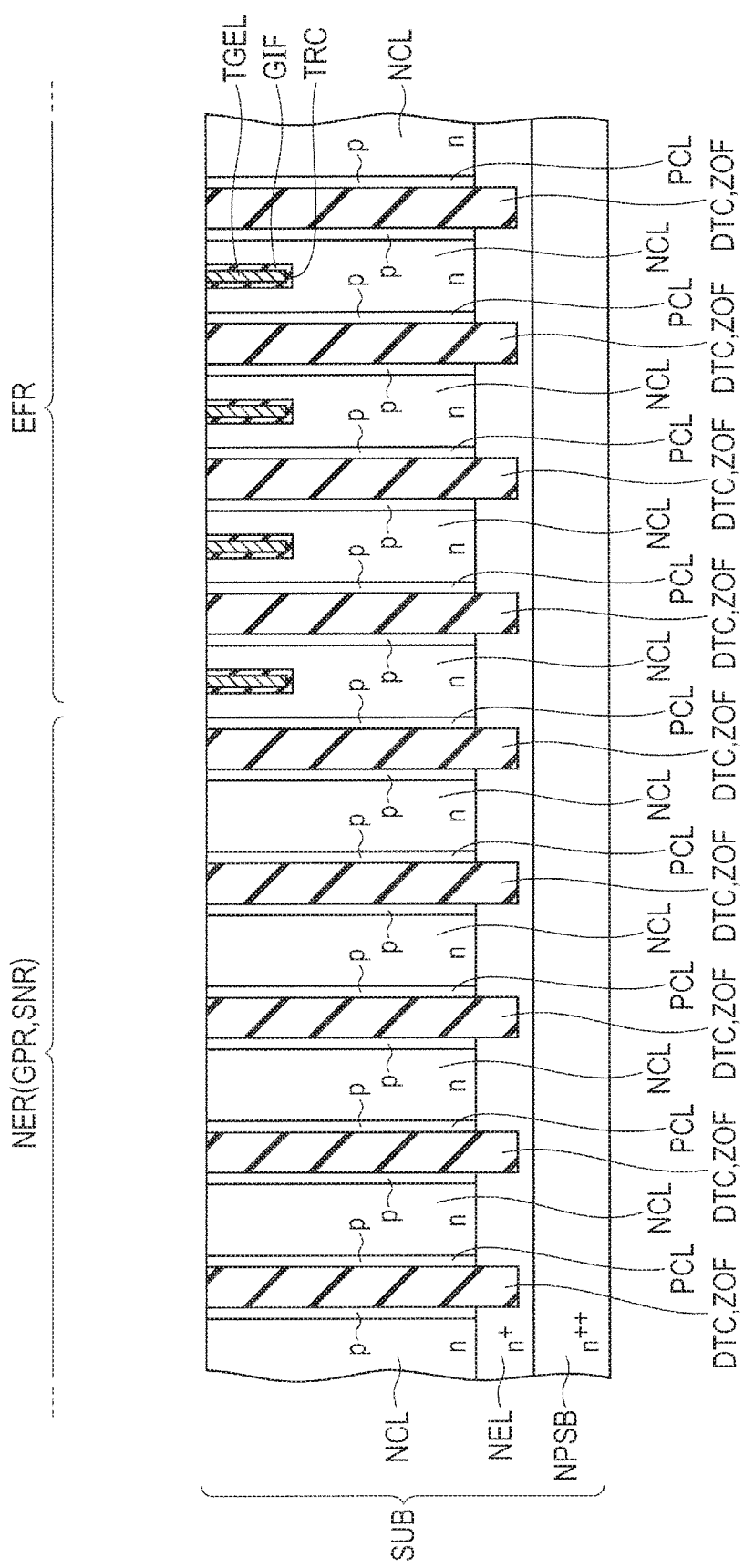
FIG. 9 is a sectional view illustrating a step after the step illustrated in FIG. 8 in the first embodiment.

Subsequently, for example, an undepicted silicon oxide film is formed so as to fill the deep trenches DTC. Subsequently, for example, chemical mechanical polishing (CMP) is performed to remove a part of the silicon oxide film, which is located over the top of the semiconductor substrate SUB, while another part of the silicon oxide film, which is located in the deep trenches DTC, is left. Consequently, as shown in FIG. 9, the buried insulators ZOF are formed in each of the cell region EFR and the snubber region NER. In the snubber region NER, the buried insulators ZOF are formed in islands in the Y-axis direction at an interval from each other (see FIGS. 3 and 4).

Subsequently, for example, a thermal oxidation process is performed to oxidize the surface of the semiconductor substrate SUB, thereby the protective insulating film TPF (see FIG. 10) is formed. Subsequently, predetermined photoengraving processing is performed to form an undepicted photoresist pattern to expose a region in which the base diffusion layer and the p-type diffusion layer are formed. The photoresist pattern is used as an implantation mask to implant a p-type impurity through the protective insulating film TPF. Subsequently, the photoresist pattern is removed.

Figure 10:
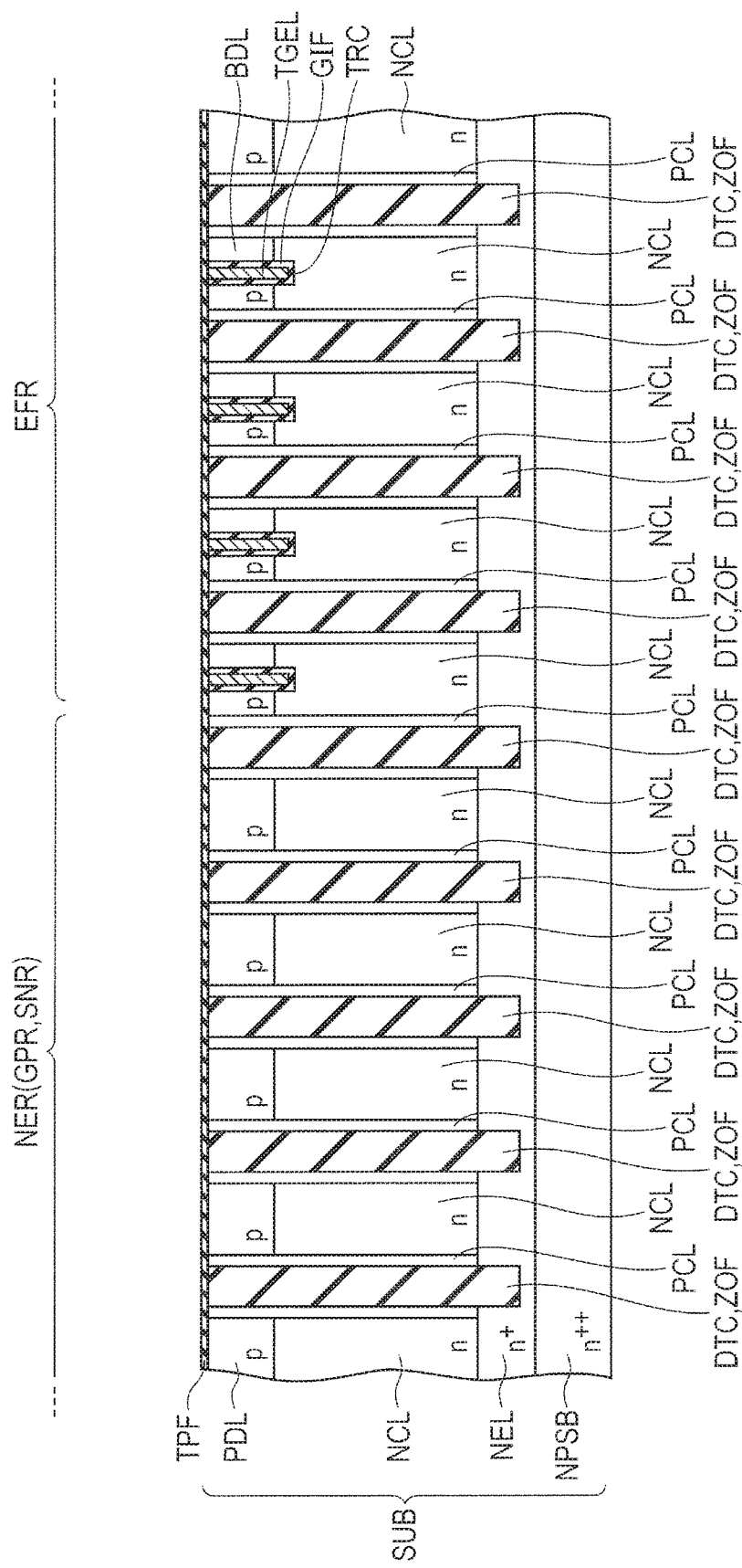
FIG. 10 is a sectional view illustrating a step after the step illustrated in FIG. 9 in the first embodiment.

As a result, as shown in FIG. 10, the p-type base diffusion layer BDL is formed in the cell region EFR. The p-type diffusion layer PDL is formed in the snubber region NER. The base diffusion layer BDL and the p-type diffusion layer PDL are formed from the surface of the semiconductor substrate SUB to a position (second depth) shallower than the bottom of the trench gate electrode TGEL. Thus, the n-type column layer NCL and the p-type diffusion layer PDL to be the resistance and the capacitance, respectively, of the snubber part SNR are formed in the snubber region NER in parallel with a step of forming the n-type column region NCL and the base diffusion layer BDL in the cell region EFR.

Figure 11:
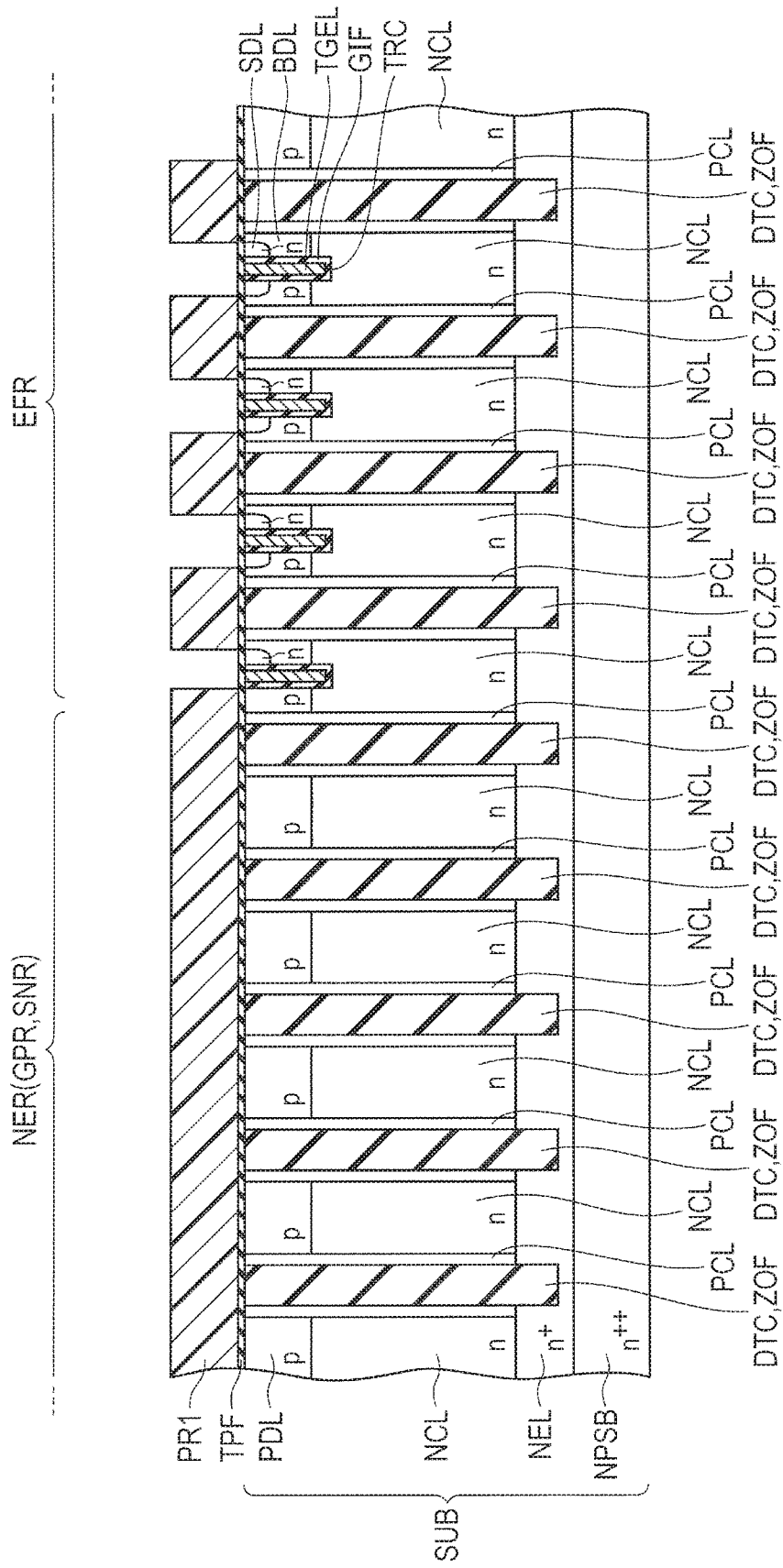
FIG. 11 is a sectional view illustrating a step after the step illustrated in FIG. 10 in the first embodiment.

Subsequently, as shown in FIG. 11, predetermined photoengraving processing is performed to form a photoresist pattern PR1 so as to cover the snubber region NER and expose a region, in which the source diffusion layer is formed, in the cell region EFR. Subsequently, the photoresist pattern PR1 is used as an implantation mask to implant an n-type impurity through the protective insulating film TPF.

As a result, the source diffusion layer SDL is formed in the cell region EFR. The source diffusion layer SDL is formed from the surface of the base diffusion layer BDL to a position shallower than the bottom of the base diffusion layer BDL. Subsequently, the photoresist pattern PR1 is removed.

Figure 12:
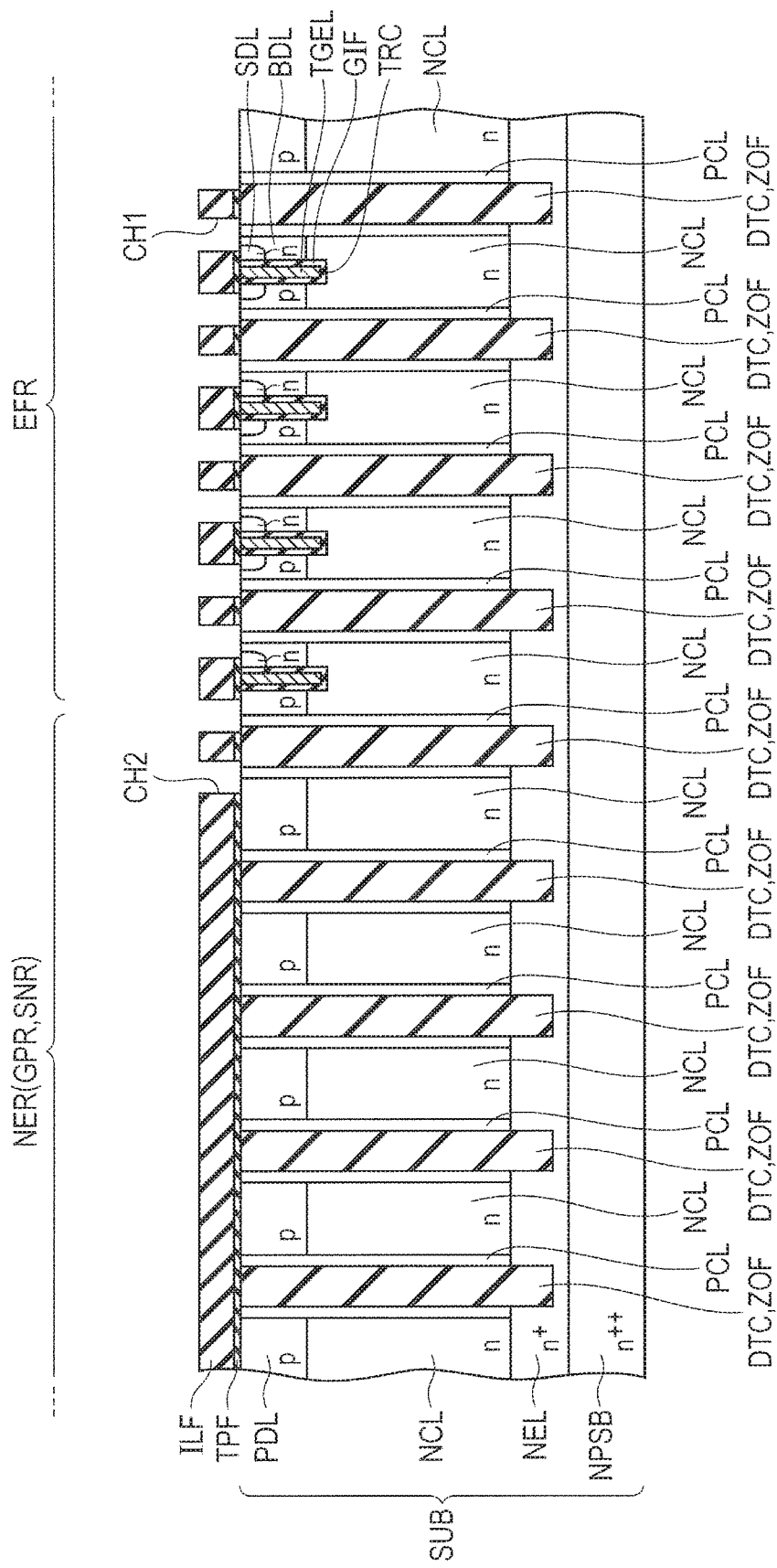
FIG. 12 is a sectional view illustrating a step after the step illustrated in FIG. 11 in the first embodiment.

Subsequently, as shown in FIG. 12, the interlayer insulating film ILF is formed so as to cover the semiconductor substrate SUB (protective insulating film TPF). Subsequently, the interlayer insulating film ILF is subjected to predetermined photoengraving processing and etching processing, so that, as shown in FIG. 12, an opening CH1 is formed so as to expose the source diffusion layer SDL and the base diffusion layer BDL. In the snubber region NER, an opening CH2 is formed so as to expose the p-type diffusion layer PDL.

Figure 13:
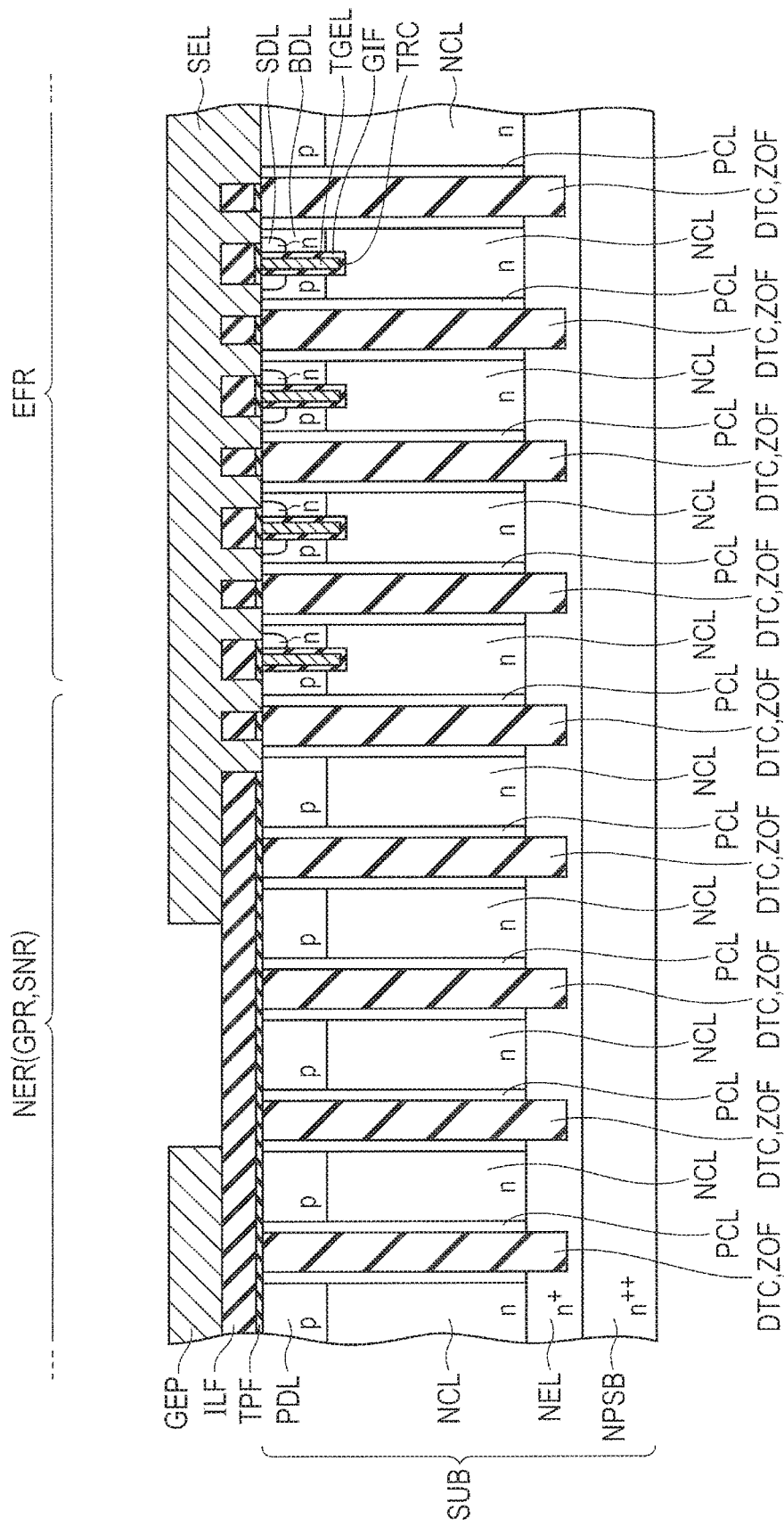
FIG. 13 is a sectional view illustrating a step after the step illustrated in FIG. 12 in the first embodiment.

Subsequently, an undepicted aluminum film is formed by a sputter process, for example, so as to cover the interlayer insulating film ILF. The aluminum film is subjected to predetermined photoengraving processing and etching processing. As a result, as shown in FIG. 13, the source electrode SEL is formed in the cell region EFR. The gate pad GEP is formed in the snubber region NER (gate pad region GPR).

Figure 14:
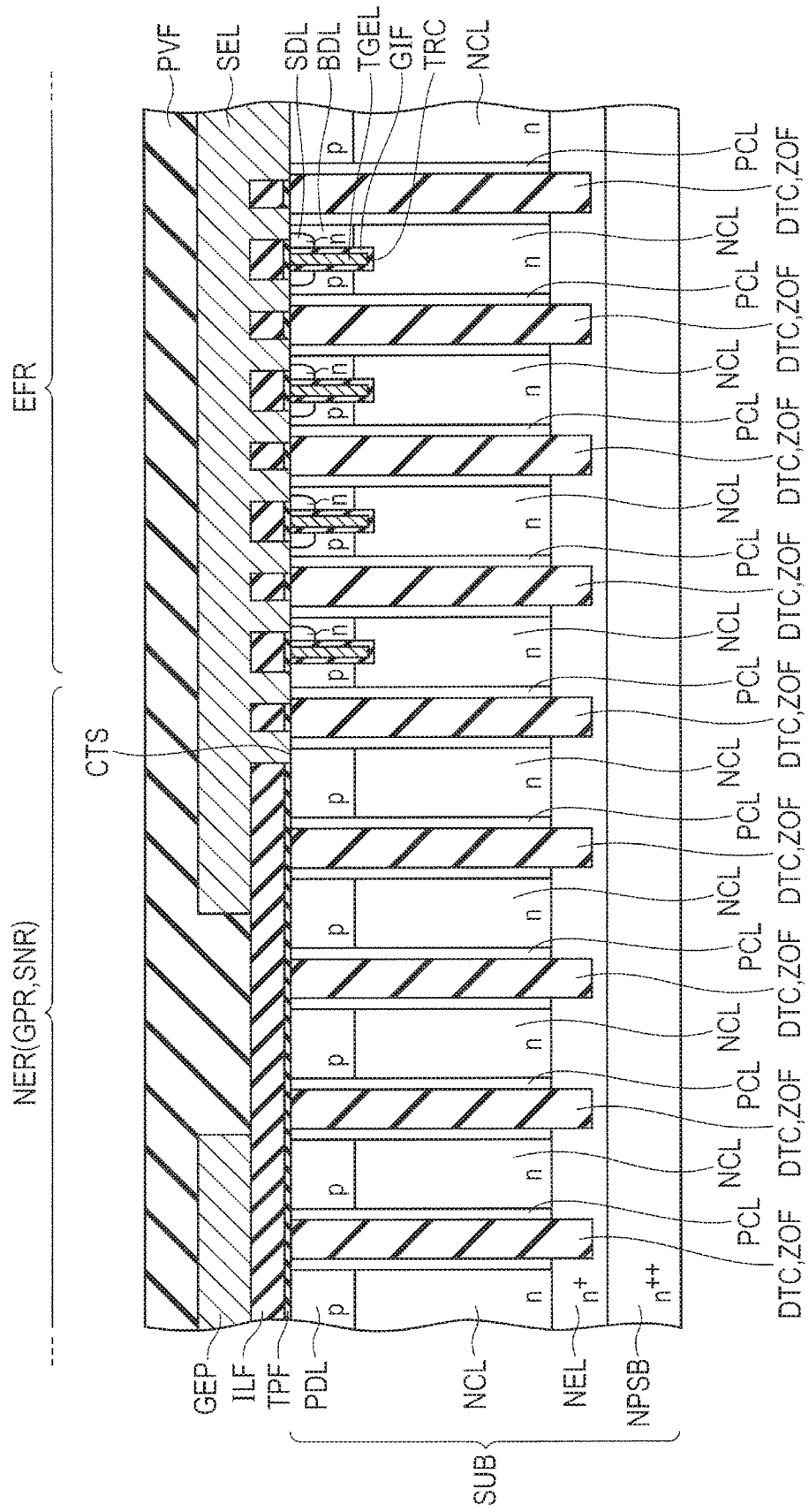
FIG. 14 is a sectional view illustrating a step after the step illustrated in FIG. 13 in the first embodiment.

Subsequently, as shown in FIG. 14, the passivation film PVF is formed so as to cover the source electrode SEL and the gate pad GEP. Subsequently, an undepicted scribe region is subjected to dicing, thereby a plurality of semiconductor devices are taken as chips. As described above, the major part of the semiconductor device PSD is completed.

In the semiconductor device PSD, the snubber region NER is defined in a region of the semiconductor substrate, in which no insulated gate field effect transistor is disposed, other than the region in which the insulated gate field effect transistor MFET is disposed. The snubber part SNR is disposed in the snubber region NER. Two functions of the snubber part SNR are now described.

The first function of the snubber part SNR is to reduce a generated surge voltage. As shown in FIG. 2, the insulated gate field effect transistor MFET originally has the parasitic capacitance CDS between the source S and the drain D. In the semiconductor device, the snubber part SNR (capacitance CDS2 and resistance RSNB) is additionally and electrically coupled in parallel to the insulated gate field effect transistor MFET.

Figure 15:
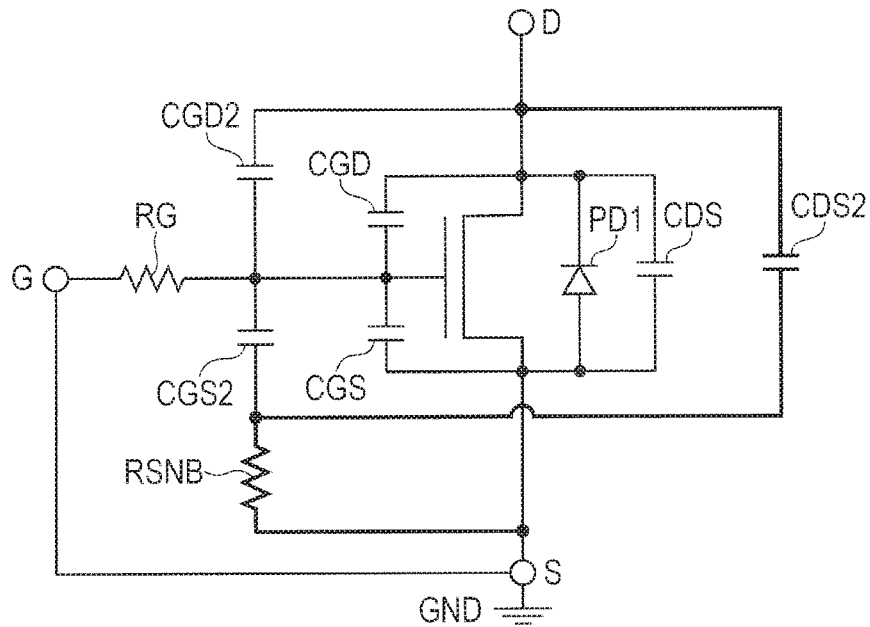
FIG. 15 is a first equivalent circuit diagram for explaining a function of a snubber part in the first embodiment.

Consequently, as shown in FIG. 15, if a surge voltage (reverse bias) is generated during recovery operation or the like of the parasitic diode PD1, the surge voltage can be absorbed as energy by the snubber part SNR and thus reduced (see a thick line in the equivalent circuit diagram). As a result, the insulated gate field effect transistor MFET or an undepicted peripheral semiconductor element can be prevented from being broken.

The second function of the snubber part SNR is to allow the insulated gate field effect transistor MFET to be self-turned on by the generated surge voltage so that the surge voltage is reduced. The self-turn-on means a phenomenon where the moment a voltage (reverse bias) is applied to a drain between the drain and the source, a voltage (potential difference) is generated between a gate and the source according to a parasitic capacitance ratio therebetween, and thus the gate is turned on.

In the semiconductor device, the moment a voltage is applied to the drain, a voltage can be further generated between the gate and the source by the snubber part SNR. Consequently, a net voltage between the gate and the source includes the voltage generated by the snubber part SNR, in addition, the voltage between the gate and the source caused by the original parasitic capacitance ratio between the gate and the source.

Figure 16:
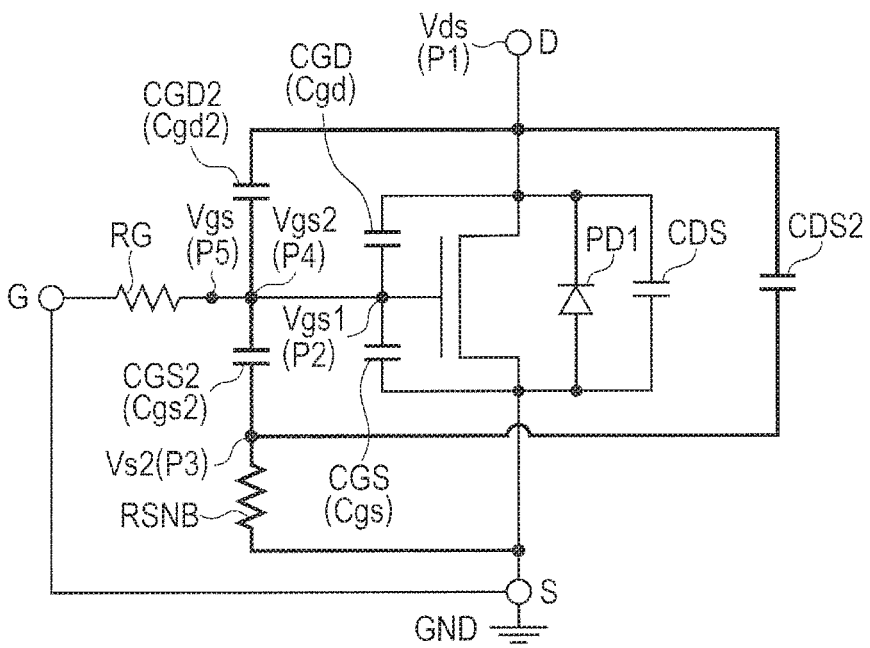
FIG. 16 is a second equivalent circuit diagram for explaining the function of the snubber part in the first embodiment.

As shown in FIG. 16, a voltage applied to the drain (point P1) is denoted as voltage Vds. A voltage generated between the source S and the capacitance CGS (point P2) is denoted as voltage Vgs1. A voltage generated between the source S and the resistance RSNB (point P3) is denoted as voltage Vs2. A voltage generated between the source S and the resistance RSNB as well as the capacitance CGS2 (point P4) is denoted as voltage Vgs2. A voltage between the gate and the source (point P5) is denoted as voltage Vgs. Capacitance of the capacitance CGS is denoted as Cgs. Capacitance of the capacitance CGD is denoted as Cgd. Capacitance of the capacitance CGD2 is denoted as Cgd2. Capacitance of the capacitance CGS2 is denoted as Cgs2.

The voltage Vgs1 is expressed by Equation 1.

$$Vgs1 = Vds \times (Cgd + Cgd2)/(Cgs + Cgs2 + Cgd + Cgd2) \tag{1}$$

The voltage Vgs2 is expressed by Equation 2.

$$Vgs2 = Vs2 \times Cgs2/(Cgs + Cgs2) \tag{2}$$

The voltage Vgs is expressed by Equation 3.

$$Vgs = Vgs1 + Vgs2 \tag{3}$$

Hence, when the voltage Vgs becomes equal to or higher than a threshold voltage Vth of the insulated gate field effect transistor (Vgs≥Vth), the insulated gate field effect transistor can be self-turned on.

As described above, when a parasitic diode performs recovery operation or the like, a surge voltage may be generated between the source and the drain due to a parasitic inductance. In an assumed case, a voltage of, for example, about 50 V is applied to the drain D while the insulated gate field effect transistor is off. When the semiconductor device has no snubber part SNR (comparative example), a voltage may instantaneously increase to about 100 V by the parasitic inductance. Hence, the insulated gate field effect transistor or the like may be broken by such an increased voltage.

In contrast to the comparative example, the semiconductor device has the snubber part SNR, thereby the moment a voltage is applied to the drain in the semiconductor device, the voltage Vgs2 can be further generated between the gate and the source (see Equation 2). Consequently, the voltage Vgs (see Equation 3) between the gate and the source (point P5) becomes higher than the corresponding voltage between the gate and the source in a semiconductor device of the comparative example, and thus the insulated gate field effect transistor is easily self-turned on.

Self-turn-on of the insulated gate field effect transistor makes a portion between the drain D and the source S to be conductive, and thus eliminates a voltage difference therebetween, so that an increase in the voltage Vds can be suppressed. Since an increase in the voltage Vds is instantaneously suppressed, the insulated gate field effect transistor is self-turned on for a period of the order of about several tens nanoseconds, for example.

The application time of the voltage Vgs can be controlled by the capacitance ratios shown in Equations 1 to 3. It is therefore possible to control a current flowing from the drain to the source after turn-on, and prevent excessive flow of the current. In other words, the current flowing from the drain to the source can be controlled by the voltage Vgs, making it possible to suppress an increase in the drain voltage.

Figure 17:
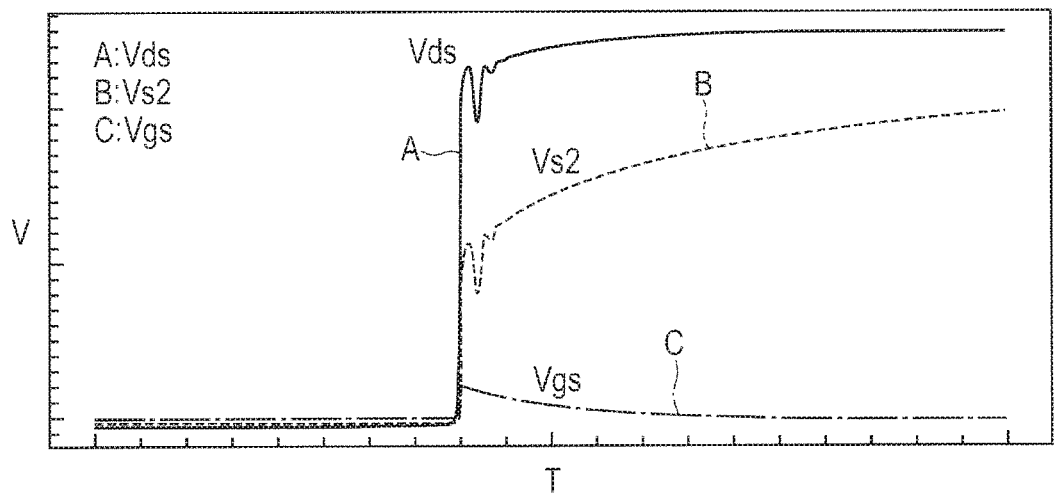
FIG. 17 is a graph showing a simulation result for explaining self-turn-on as a function of the snubber part in the first embodiment.

FIG. 17 is a graph showing results of evaluation by simulation of the voltages Vds, Vs2, and Vgs. The graph shows time on the abscissa and voltage on the ordinate.

Graph A shows temporal change of the voltage Vds. Graph B shows temporal change of the voltage Vs2. Graph C shows temporal change of the voltages Vgs. As shown in FIG. 17, the moment the voltage Vds is applied to the drain, the voltage Vs2 increases. Such an increase in the voltage Vs2 increases the voltages Vgs, causing self-turn-on of the insulated gate field effect transistor, and thus an abrupt increase in the voltage Vds is suppressed.

Through evaluation of the inventors, it has been found that if the resistance RSNB of the snubber part SNR does not have a certain high resistance value, the voltage Vs2 cannot be generated. It has been further found that the capacitance of the capacitance CDS2 of the snubber part SNR contributes to time for generating the voltage Vs2.

It has been further found that the resistance between the gate and the source contributes to time for holding the voltage Vgs, and the resistance more contributes to a reduction in the surge voltage as it is larger. From the voltage condition (Vgs Vth), the self-turn-on is effective in the insulated gate field effect transistor having a relatively low threshold voltage Vth.

The semiconductor device employs a super junction structure, in which the n-type column layer NCL and the p-type column layer PCL are alternately disposed. The super junction structure enhances the effect of reducing the surge voltage. This is described below.

Figure 18:
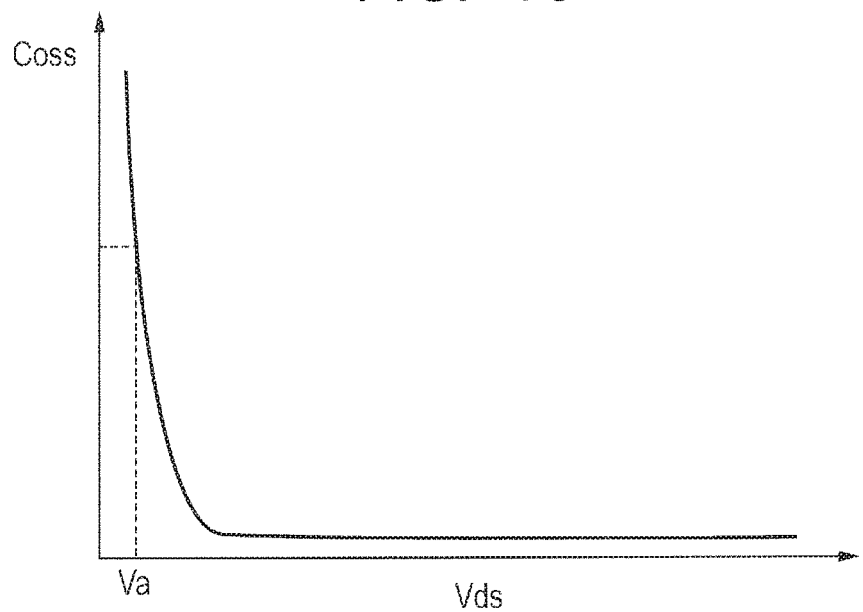
FIG. 18 is a graph showing a relationship between a voltage applied to a drain and output capacitance to explain the function of the snubber part in the first embodiment.

First, a relationship between the voltage Vds and output capacitance Coss in the super junction structure is described. As the voltage Vds applied to the drain is increased, a depletion layer expands from a pn junction surface, and finally a region between the n-type column layer NCL and the p-type column layer PCL is depleted. The relationship between the voltage Vds and the output capacitance Coss in such a situation is shown in FIG. 18. The output capacitance Coss means a capacitance per unit area corresponding to the sum of the capacitance per unit area between the drain and the source and the capacitance per unit area between the drain and the gate. Since the capacitance between the drain and the gate is sufficiently smaller than the capacitance between the drain and the source, the output capacitance Coss can be substantially considered as a capacitance per unit area between the drain and the source.

As shown in FIG. 18, when the voltage Vds is low, the depletion layer extends small, and thus the output capacitance Coss is relatively large. As the voltage Vds increases, the depletion layer gradually extends. Specifically, depletion layers expand from a longitudinal pn junction surface of the n-type column layer NCL and the p-type column layer PCL and are finally connected together, and thus such a connected depletion layer suddenly expands in a longitudinal direction. This drastically decreases the output capacitance Coss. The graph reveals that capacitance per unit area can be increased when a voltage applied to the drain is relatively low. That is, capacitance of the snubber part SNR can be increased.

Figure 19:
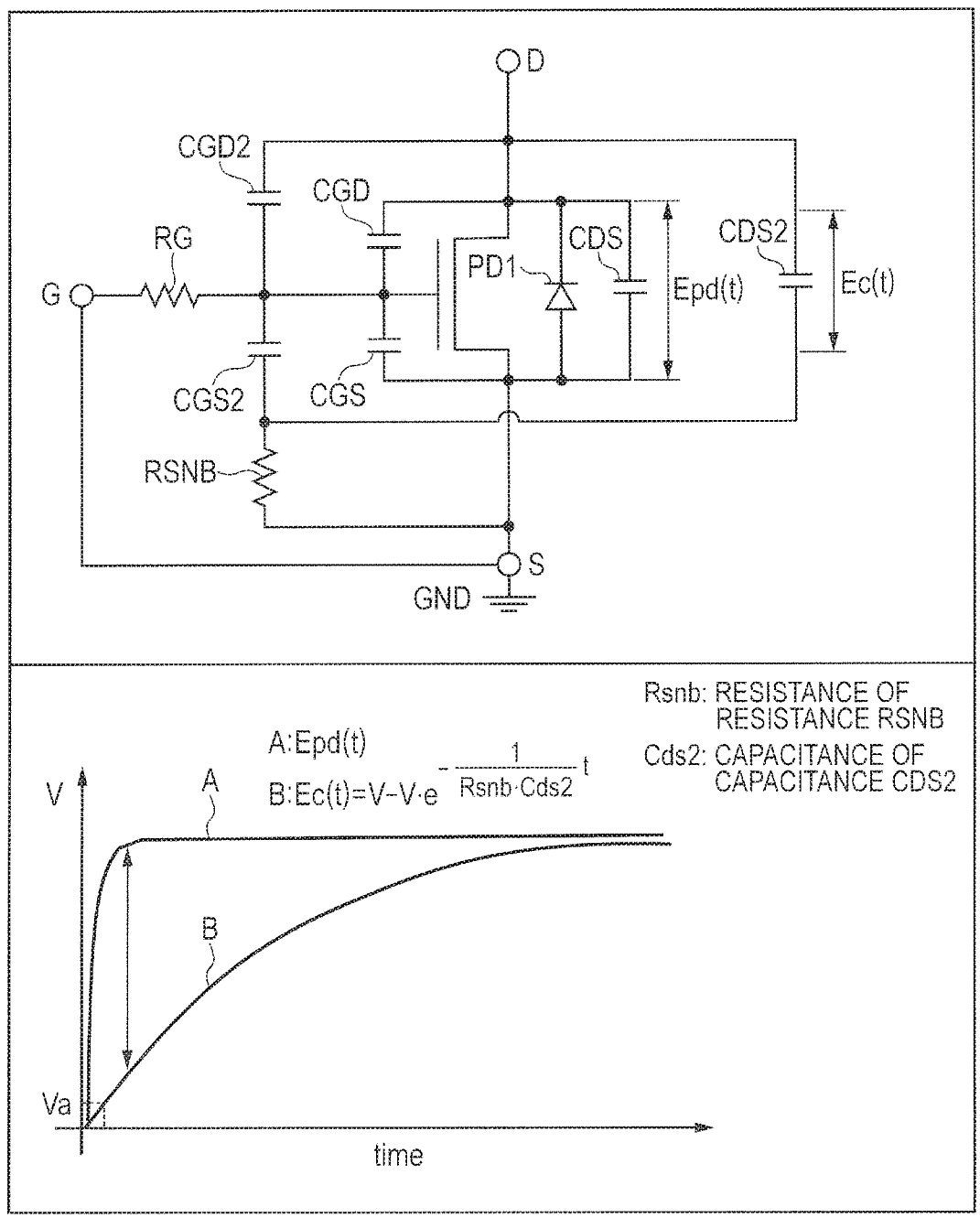
FIG. 19 is a graph showing a temporal change in each of a voltage applied to a parasitic diode and a voltage applied to a parasitic capacitance to explain the function of the snubber part in the first embodiment.

Subsequently, behavior of a voltage applied to a capacitance is described. As shown in FIG. 19, a voltage applied to the parasitic diode PD1 of the insulated gate field effect transistor is denoted ad Epd(t). A voltage applied to the capacitance CDS2 of the snubber part SNR is denoted ad Ec(t). The graph shows a temporal change of each of Epd(t) and Ec(t) when a voltage V is applied to the drain. The graph shows time on the abscissa and voltage on the ordinate.

When a voltage V is applied to the drain, the voltage Epd (t) applied to the parasitic diode PD1 immediately increases, and reaches the voltage V in about several tens nanoseconds, for example. On the other hand, since the capacitance CDS2 is electrically coupled to the resistance RSNB, the voltage Ec(t) applied to the capacitance CDS2 does not immediately increase, but gradually increases while being transiently delayed with respect to the voltage Ecds(t). A resistance value of the resistance RSNB is denoted as Rsnb, and capacitance of the capacitance CDS2 is denoted as Cds2, and thus the voltage Ec (t) is expressed by Equation 4.

$$Ec(t)=V-V\cdot\exp(-1/(Rsnb\cdot Cds2)\cdot t) \quad (4)$$

Hence, the voltage Ec(t) applied to the capacitance CDS2 is lower than the voltage V within a predetermined time after application of the voltage V to the drain. As shown in FIG. 18, when the voltage Ec(t) applied to the capacitance CDS2 is relatively low, the depletion layer extends relatively small, and thus capacitance per unit area of the capacitance CDS2 can be increased. As shown in FIG. 19, for example, the voltage Ec(t) is denoted as voltage Va at a time point before the voltage Epd(t) applied to the parasitic diode PD1 reaches the voltage V. As shown in FIG. 18, the output capacitance Coss is sufficiently high at such a time point.

Through evaluation of the inventors, it has been found that for the insulated gate field effect transistor having a drain withstand voltage of about 100 V, the output capacitance Coss at a sufficiently low voltage Vds is about 100 times as large as the output capacitance Coss in the state of pinch-off of the column. The state of pinch-off of the column means a state where the depletion layers expand from the longitudinal pn junction surface between the n-type column layer NCL and the p-type column layer PCL and are finally connected together, leading to complete depletion.

The semiconductor device employs the super junction structure, and has the additional snubber part SNR. The voltage applied to the capacitance CDS2 of the snubber part SNR increases while being transiently delayed with respect to the increase in the voltage Vds. Consequently, the capacitance of the capacitance CDS2 can be increased at an initial point at which the voltage Vds (surge voltage) is applied, which resultantly contributes to a reduction in surge voltage.

The depletion layer is desired to gradually expand with the voltage Vds applied to the drain, i.e., depletion is desired to be gradually performed in order to secure the capacitance of the capacitance CDS2 to reduce the surge voltage generated between the drain and the source. In a desired relationship between the output capacitance Coss and the voltage Vds (see FIG. 18), the output capacitance Coss gradually decreases with an increase in the voltage Vds.

In the semiconductor device, the snubber region, in which the snubber part SNR is formed, is defined in a region in which the insulated gate field effect transistor is not formed, and is defined in the gate pad region GPR herein. Area of the gate pad region GPR is about a few percent of the area of the cell region EFR in which the insulated gate field effect transistor is formed.

Even if the snubber part SNR is formed in such an a really disadvantageous gate pad region GPR, the voltage applied to the capacitance CDS2 is increased while being transiently delayed with respect to an increase in the voltage Vds, thereby the capacitance of the capacitance CDS2 can be increased at the initial point at which the voltage Vds (surge voltage) is applied, which contributes to a reduction in the surge voltage.

In addition, for example, the length of the snubber part SNR extending in the Y-axis direction (see FIG. 4) can be adjusted to form the snubber part SNR having a capacitance CDS2 and a resistance RSNB optimal to reduce the surge voltage in accordance with use of the semiconductor device. Furthermore, such a snubber part SNR can be formed in parallel with a step of forming the insulated gate field effect transistor in the cell region FER only by changing a mask pattern without an additional step.

Although the semiconductor device has been described with an exemplary case where the snubber region NER is defined in the gate pad region GPR, the region, in which the insulated gate field effect transistor is not formed, may be defined in the diode pad region DPR (see FIG. 1) in which a diode as a temperature detecting element is disposed.

Second Embodiment

A second embodiment is described with a second example of the semiconductor device, in which the snubber region is defined in the gate pad region having the gate pad disposed therein.

Figure 20:
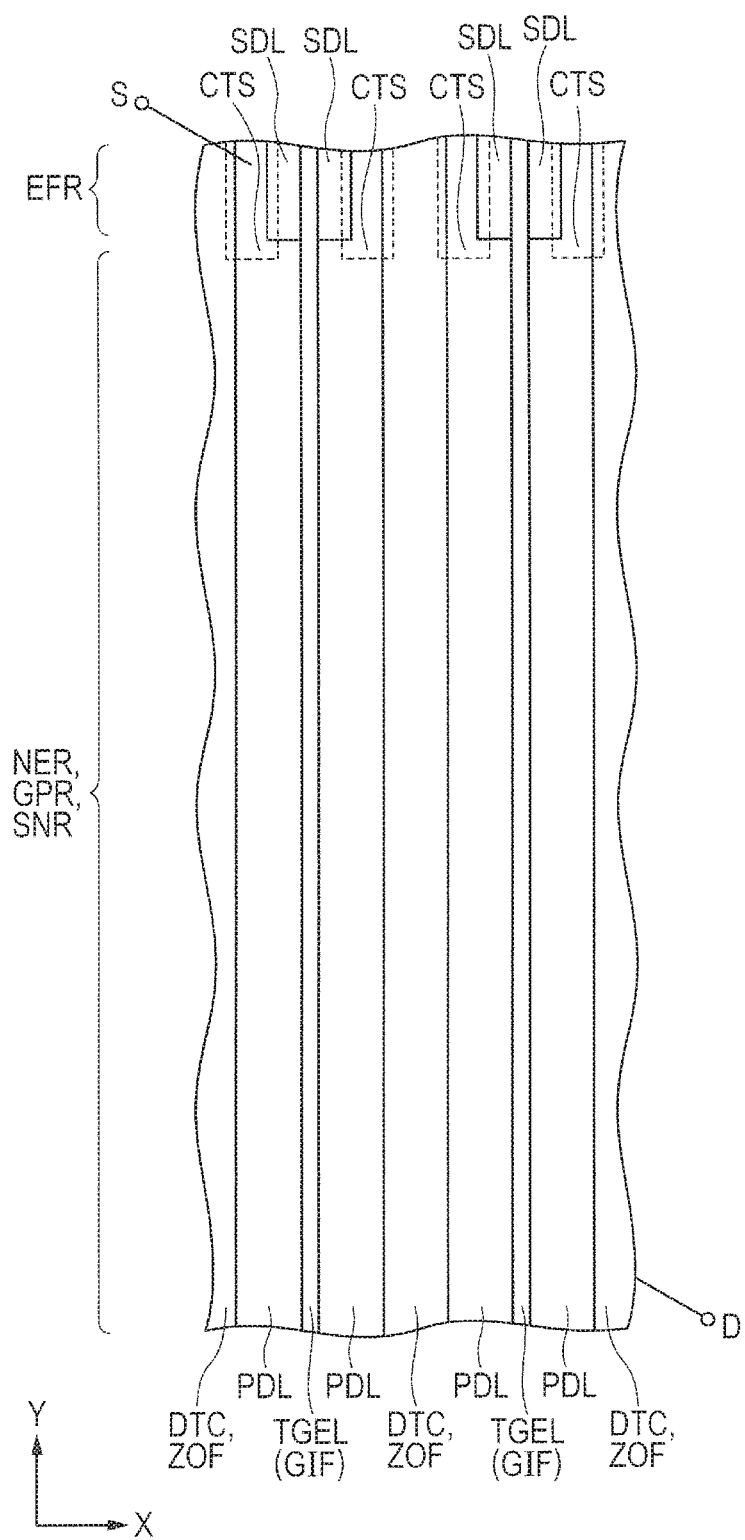
FIG. 20 is a partial plan view illustrating an example of a planar pattern of a portion corresponding to an area within the frame A1 shown in FIG. 1 in a semiconductor device of a second embodiment.
Figure 21:
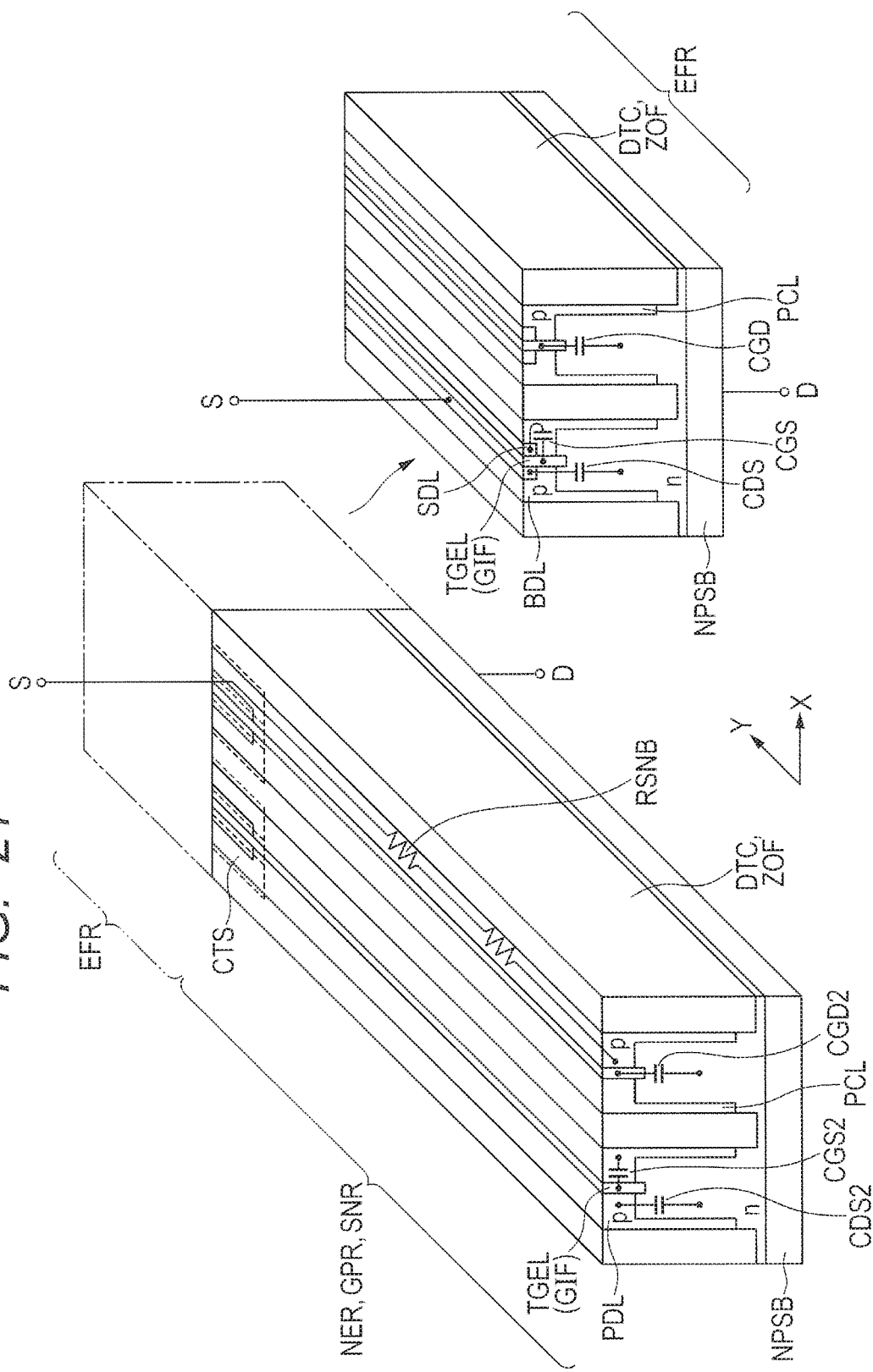
FIG. 21 is a perspective section view illustrating a structure of the portion corresponding to the area within the frame A1 shown in FIG. 1 in the second embodiment.

As shown in FIGS. 20 and 21, in the cell region EFR, the trench gate electrodes TGEL are formed in stripes at an interval from each other in the X-axis direction while extending in the Y-axis direction, for example. The buried insulators ZOF extending in the Y-axis direction are each formed in a region located between a first trench gate electrode TGEL and a second trench gate electrode TGEL adjacent to each other. The buried insulators ZOF are formed in stripes at an interval from each other in the X-axis direction.

In the snubber region NER, the trench gate electrodes TGEL are formed in stripes at an interval from each other in the X-axis direction while extending in the Y-axis direction, for example. The buried insulators ZOF extending in the Y-axis direction are each formed in a region located between a first trench gate electrode TGEL and a second trench gate electrode TGEL adjacent to each other. The buried insulators ZOF are formed in stripes at an interval from each other in the X-axis direction.

Since other configurations are similar to those of the semiconductor device shown in FIGS. 3, 4, and 5, the same components are designated by the same reference numeral, and duplicated description is omitted except when required.

A method of manufacturing the semiconductor device of the second embodiment is now described. The semiconductor device of the second embodiment can be formed by the same manufacturing steps as the series of manufacturing steps of the semiconductor device described in the first embodiment except that a pattern of the trench gate electrodes and a pattern of the deep trenches are each changed. Specifically, in the step of forming the trench gate electrodes (see FIG. 6), the trench gate electrodes are formed in stripes in each of the cell region EFR and the snubber region NER. In the step of forming the deep trenches DTC (see FIG. 7), the deep trenches DTC are formed in stripes.

The semiconductor device of the second embodiment provides the following effect in addition to the effect described in the first embodiment. Specifically, in the snubber region NER, the buried insulators ZOF are formed in stripes in a manner of penetrating the p-type diffusion layer PDL to be the resistance RSNB. Consequently, a current flows through the p-type diffusion layer PDL along a narrow path compared with the case where the buried insulators ZOF are formed in islands, leading to a higher resistance value of the resistance RSNB.

As described above, a higher resistance value of the resistance RSNB allows generation of a higher voltage Vs2 (see FIG. 16). This makes it possible to increase the voltage Vgs required for self-turn-on of the insulated gate field effect transistor. As a result, the surge voltage can also be reduced in the insulated gate field effect transistor having a higher threshold voltage Vth.

Third Embodiment

A third embodiment is described with a third example of the semiconductor device, in which the snubber region is defined in the gate pad region having the gate pad disposed therein.

Figure 22:
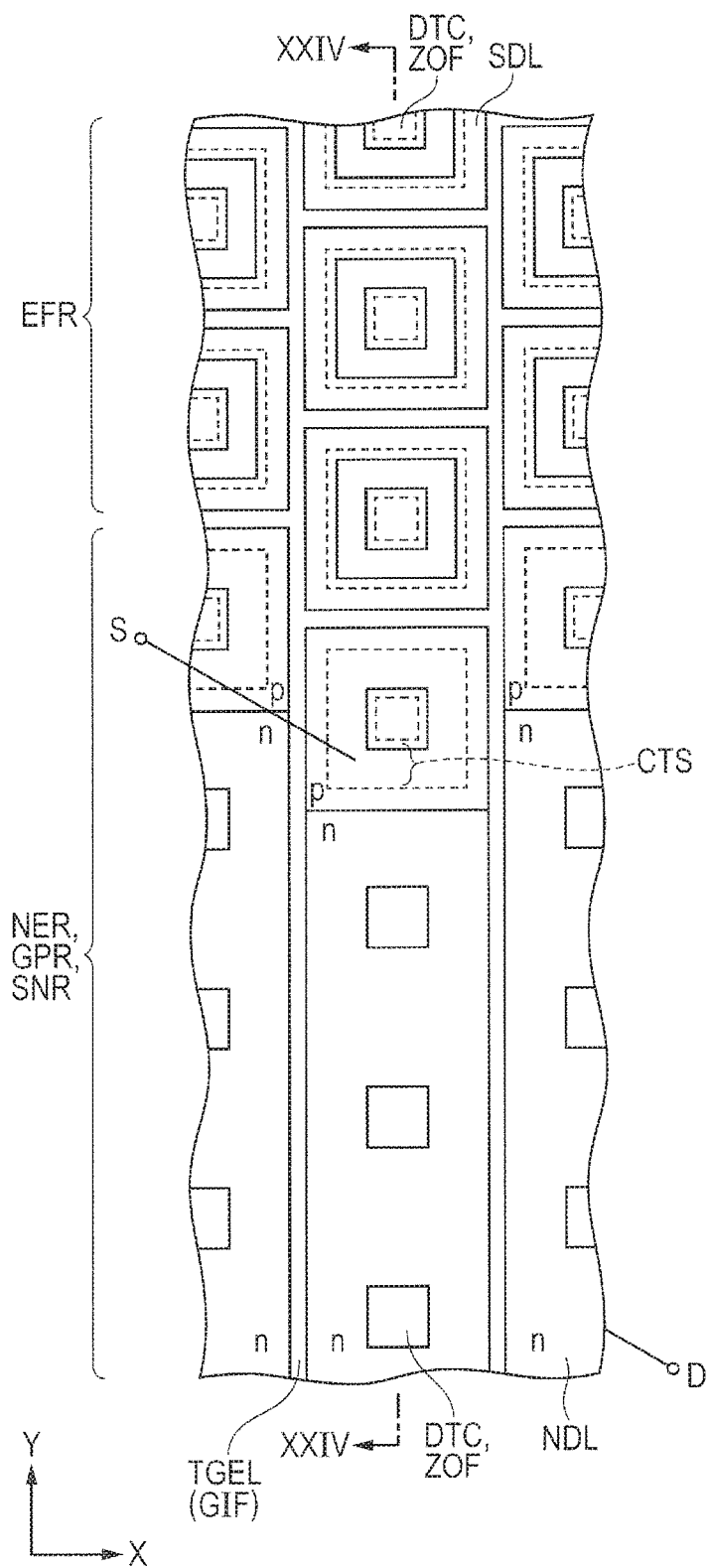
FIG. 22 is a partial plan view illustrating an example of a planar pattern of a portion corresponding to an area within the frame A1 shown in FIG. 1 in a semiconductor device of a third embodiment.
Figure 23:
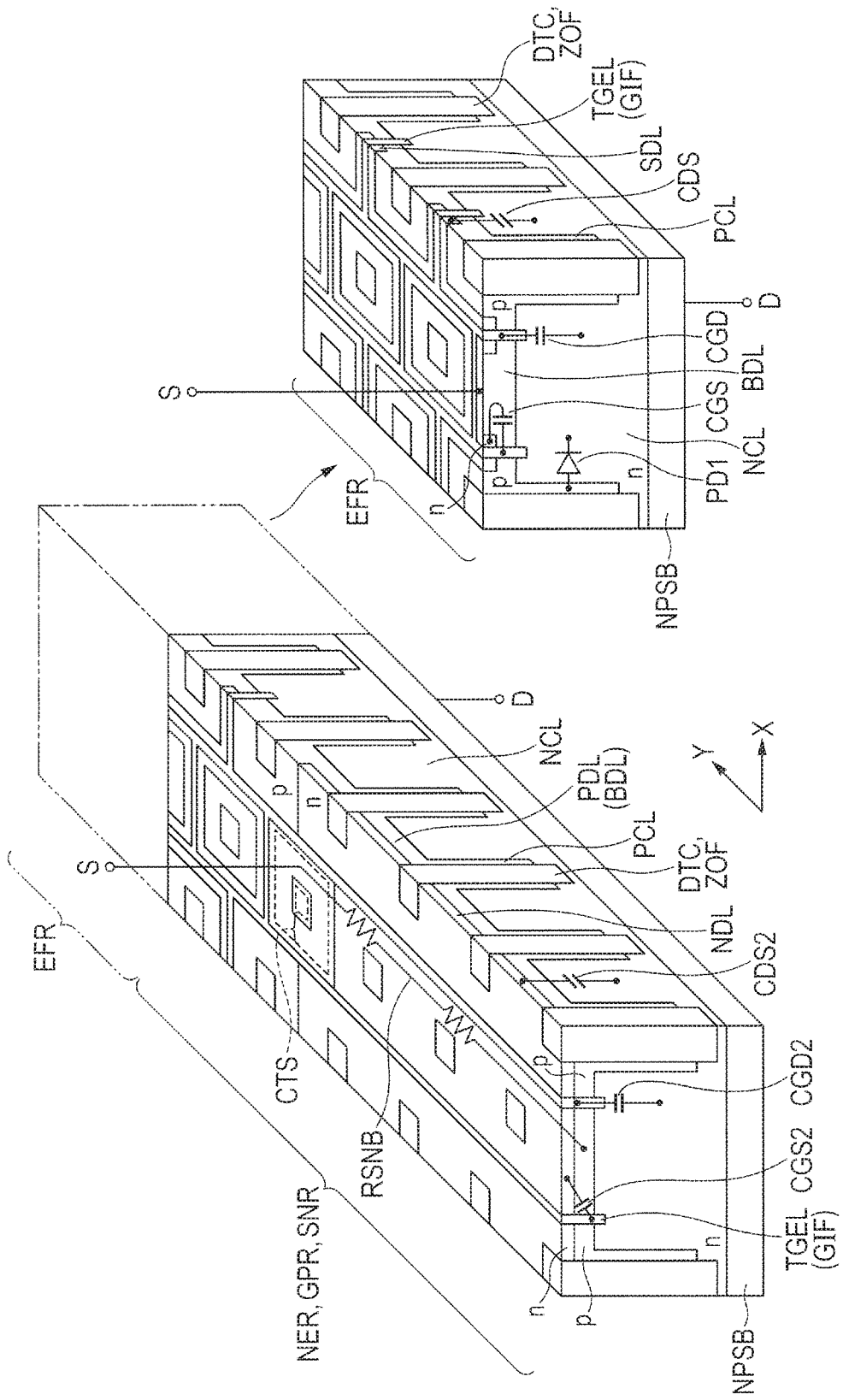
FIG. 23 is a perspective section view illustrating a structure of the portion corresponding to the area within the frame A1 shown in FIG. 1 in the third embodiment.
Figure 24:
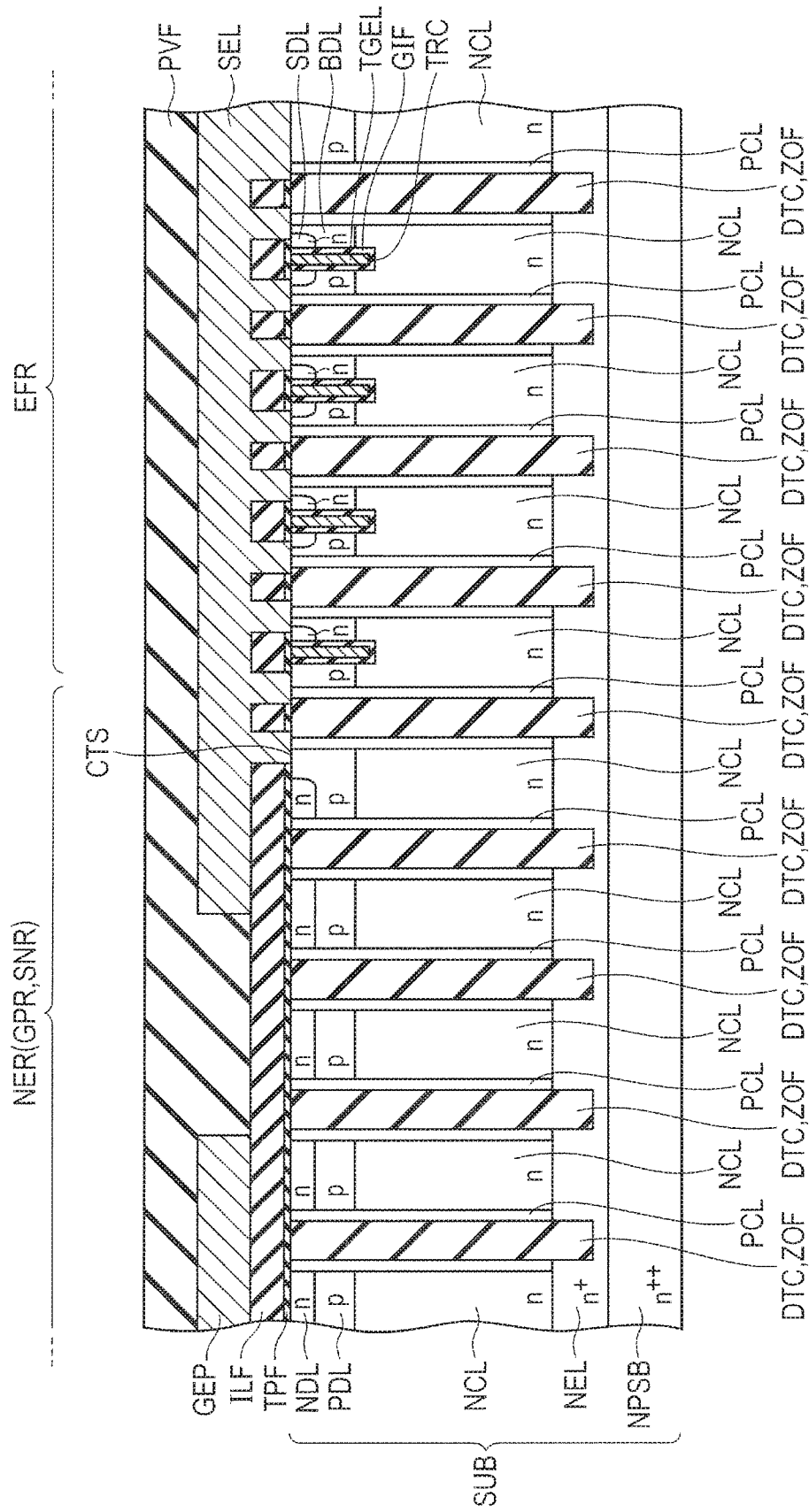
FIG. 24 is a sectional view along a sectional line XXIV-XXIV shown in FIG. 22 in the third embodiment.

As shown in FIGS. 22, 23, and 24, the p-type diffusion layer PDL is formed from a first main surface of the semiconductor substrate SUB to a predetermined depth in the snubber region NER. The n-type diffusion layer NDL is formed from the surface of the p-type diffusion layer PDL to a depth shallower than the bottom of the p-type diffusion layer PDL. The n-type diffusion layer NDL is formed so as to extend, for example, in the Y-axis direction in a manner of excluding each contact CTS at which the p-type diffusion layer PDL is in contact with the source electrode SEL.

Since other configurations are similar to those of the semiconductor device shown in FIGS. 3, 4, and 5, the same components are designated by the same reference numeral, and duplicated description is omitted except when required.

A method of manufacturing the semiconductor device of the third embodiment is now described. The n-type diffusion layer NDL is formed in parallel with a step of forming the n-type source diffusion layer SDL.

Figure 25:
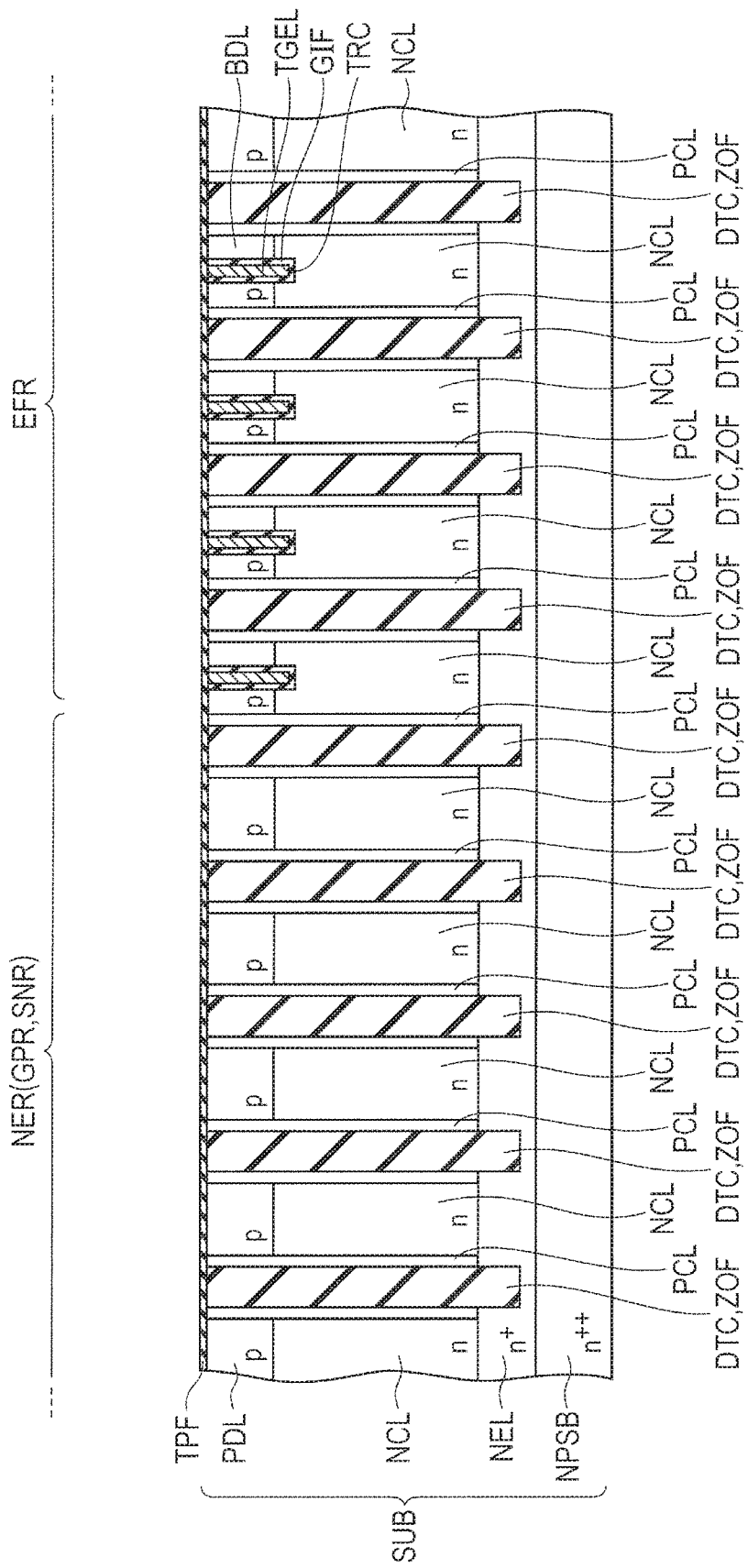
FIG. 25 is a sectional view illustrating one step of a method of manufacturing the semiconductor device in the third embodiment.

First, as shown in FIG. 25, the n-type column layer NCL and the p-type diffusion layer PDL to be a resistance and a capacitance, respectively, of the snubber part SNR are formed in the snubber region NER through steps similar to the steps shown in FIGS. 6 to 10. The n-type column layer NCL and the base diffusion layer BDL are formed in the cell region EFR.

Figure 26:
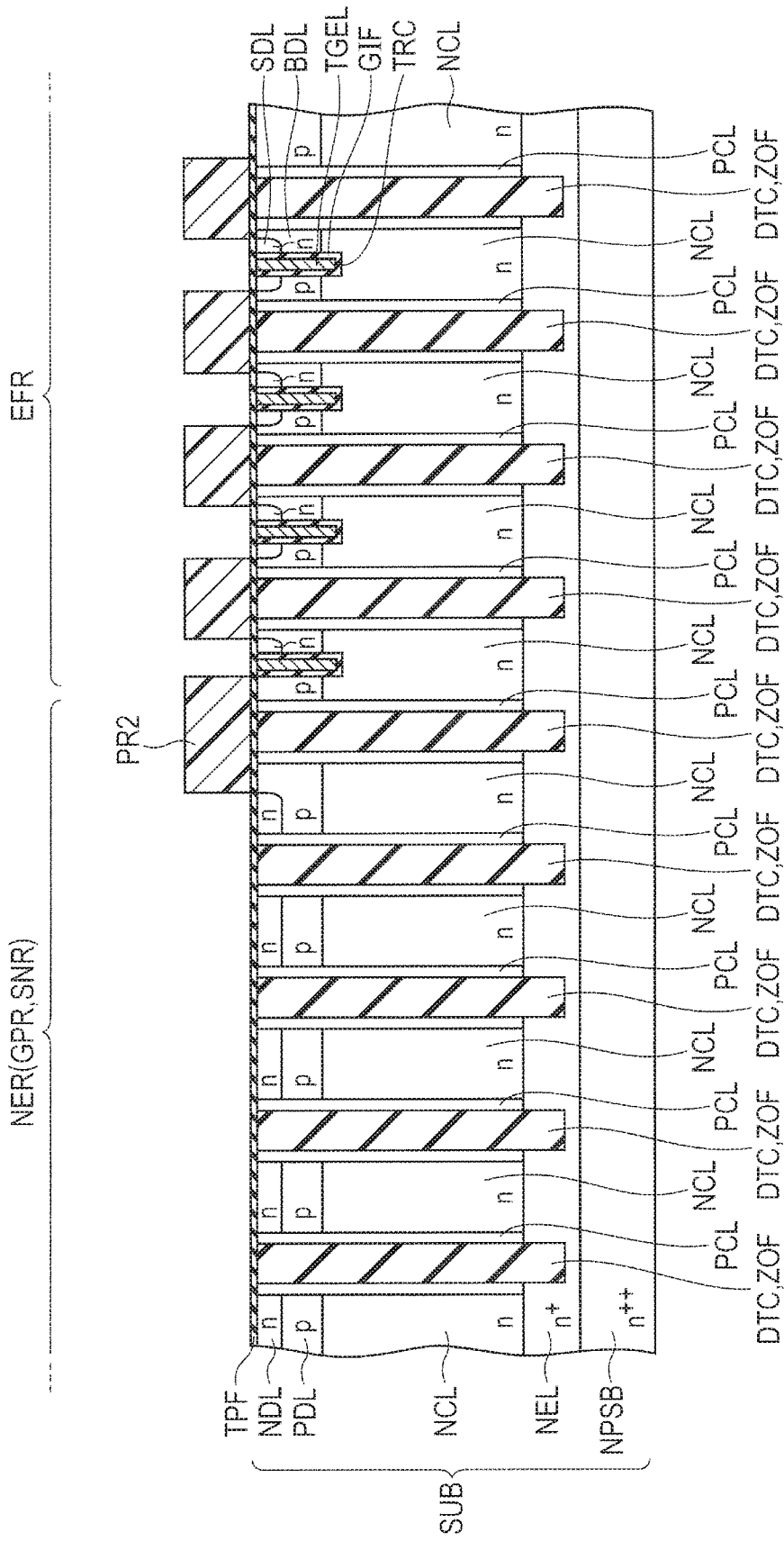
FIG. 26 is a sectional view illustrating a step after the step illustrated in FIG. 25 in the third embodiment.

Subsequently, as shown in FIG. 26, predetermined photoengraving processing is performed to form a photoresist pattern PR2 that expose a region, in which the n-type diffusion layer is formed, in the snubber region NER, and expose a region, in which the source diffusion layer is formed, in the cell region EFR. Subsequently, the photoresist pattern PR2 is used as an implantation mask to implant an n-type impurity through the protective insulating film TPF.

As a result, the n-type diffusion layer NDL is formed in the snubber region NER. The source diffusion layer SDL is formed in the cell region EFR. Subsequently, the photoresist pattern PR2 is removed. Subsequently, a major part of the semiconductor device shown in FIGS. 22, 23, and 24 is completed through steps similar to the steps shown in FIGS. 12 to 14.

The semiconductor device of the third embodiment provides the following effect in addition to the effect described in the first embodiment. Specifically, in the snubber region NER, the n-type diffusion layer NDL is formed from the first main surface of the semiconductor substrate SUB to a depth shallower than the bottom of the p-type diffusion layer PDL. That is, the n-type diffusion layer NDL is formed on the surface of the p-type diffusion layer PDL to be the resistance RSNB of the snubber part SNR. Hence, the resistance value of the resistance RSNB is high compared with the case where no n-type diffusion layer NDL is formed.

As described in the first embodiment, a higher resistance value of the resistance RSNB allows generation of a higher voltage Vs2 (see FIG. 16). This makes it possible to increase the voltage Vgs required for self-turn-on of the insulated gate field effect transistor. As a result, the surge voltage can also be reduced in the insulated gate field effect transistor having a higher threshold voltage Vth.

Fourth Embodiment

A fourth embodiment is described with a fourth example of the semiconductor device, in which the snubber region is defined in the gate pad region having the gate pad disposed therein.

Figure 27:
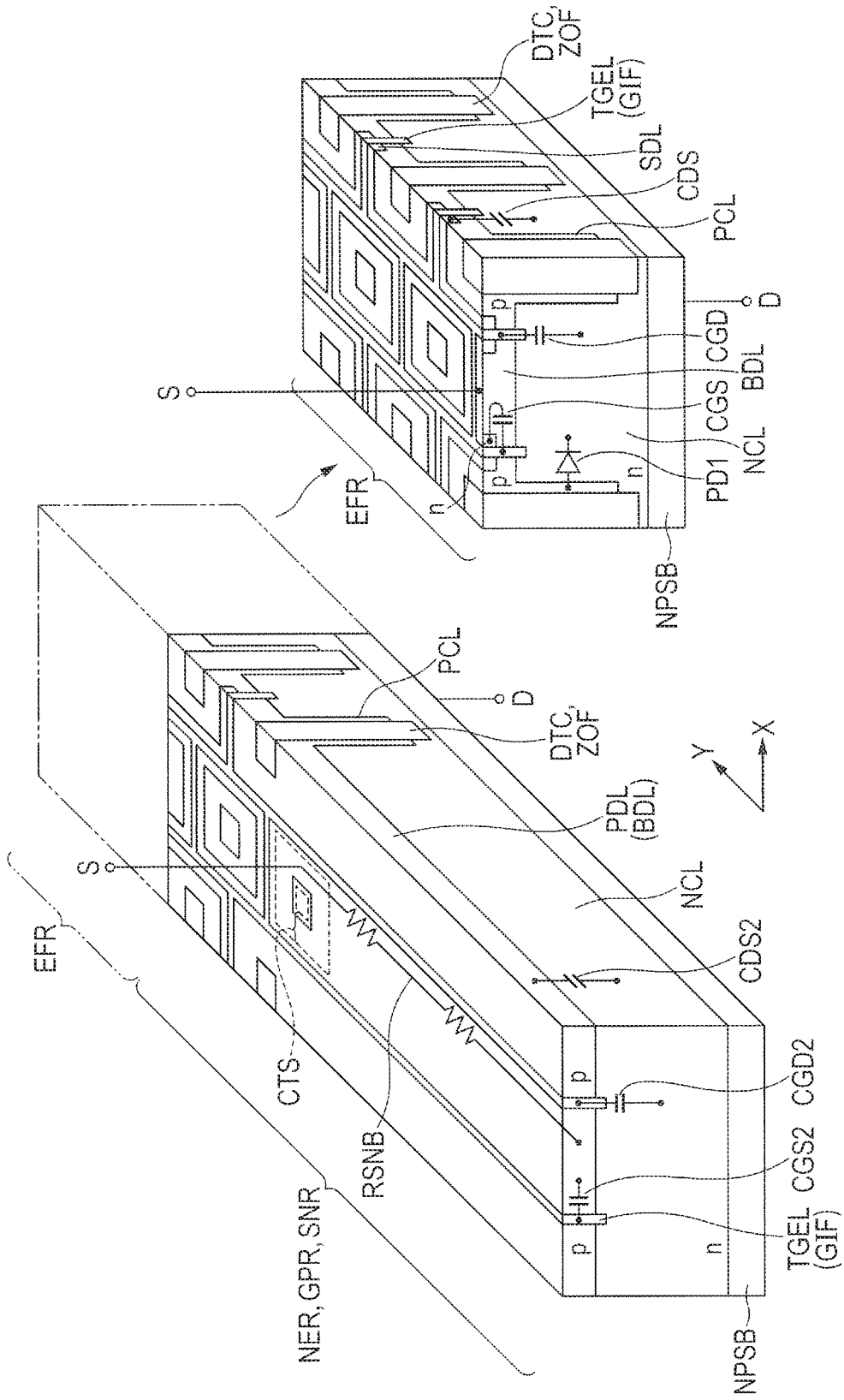
FIG. 27 is a perspective section view illustrating a structure of the portion corresponding to the area within the frame A1 shown in FIG. 1 of a semiconductor device of a fourth embodiment.

As shown in FIG. 27, the buried insulators ZOF are formed in the cell region EFR. On the other hand, no buried insulator ZOF is formed in the snubber region NER. Since other configurations are similar to those of the semiconductor device shown in FIGS. 3, 4, and 5, the same components are designated by the same reference numeral, and duplicated description is omitted except when required.

A method of manufacturing the semiconductor device of the fourth embodiment is now described. The semiconductor device of the fourth embodiment can be formed by the same manufacturing steps as the series of manufacturing steps of the semiconductor device described in the first embodiment except that a pattern of the deep trenches is changed. Specifically, in the step of forming the deep trenches, the deep trenches are formed only in the cell region EFR, and no deep trench is formed in the snubber region NER.

In the semiconductor device of the fourth embodiment, no buried insulator ZOF is formed in the p-type diffusion layer PDL to be the resistance RSNB in the snubber region NER. Hence, for example, length of the p-type diffusion layer PDL extending in the Y-axis direction is set relatively long, thereby the resistance value of the resistance RSNB can be set to a desired high value. A higher resistance value of the resistance RSNB allows generation of a higher voltage Vs2 (see FIG. 16). This makes it possible to increase the voltage Vgs required for self-turn-on of the insulated gate field effect transistor, which contributes to a reduction in surge voltage.

Fifth Embodiment

A fifth embodiment is described with a semiconductor device in which the snubber region is defined, for example, in the gate pad region, and another additional capacitance is formed in a peripheral region. In the semiconductor substrate, the base diffusion layer BDL (see FIG. 5) in the cell region EFR is formed as the p-type diffusion layer so as to further extend toward the outside of the cell region EFR. The circumferential end of the p-type diffusion layer is located along a circumference of the semiconductor substrate at a position distant from the circumference. The peripheral region means a region located between the circumferential end of the p-type diffusion layer and the cell region. The same holds true for other embodiments.

In the semiconductor device, for example, the snubber region is defined in the gate pad region (see FIG. 1). Furthermore, another capacitance is formed in the peripheral region. That capacitance is electrically coupled in parallel to the snubber region SNR.

Figure 28:
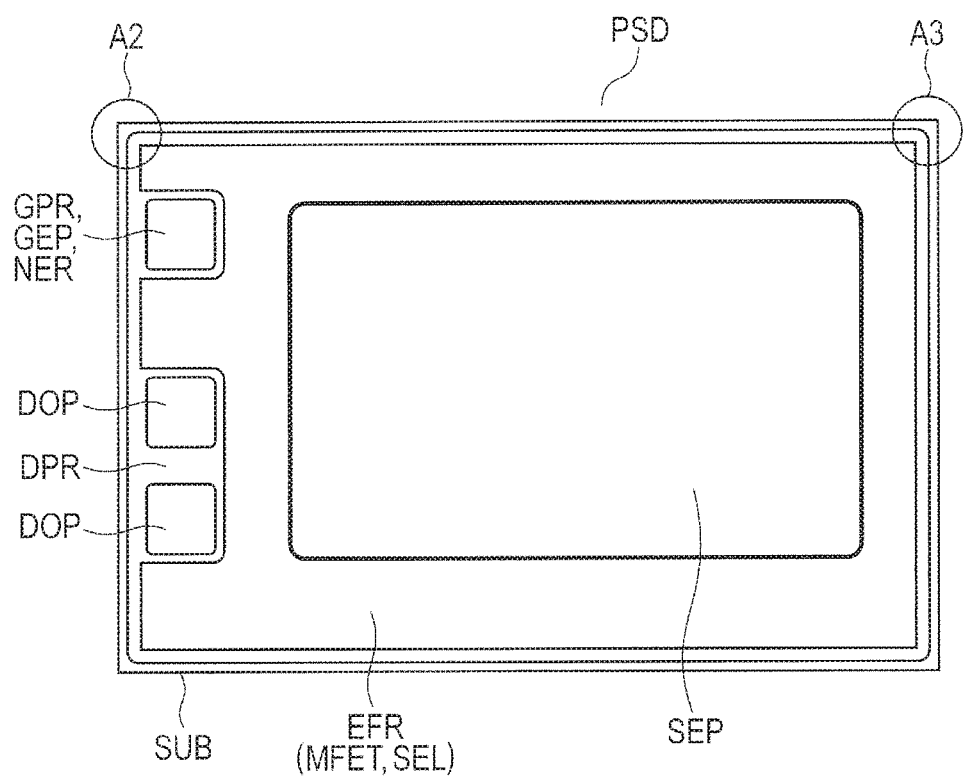
FIG. 28 is a plan view illustrating an example of a planar pattern of a semiconductor device in a chip form according to a fifth embodiment.
Figure 29:
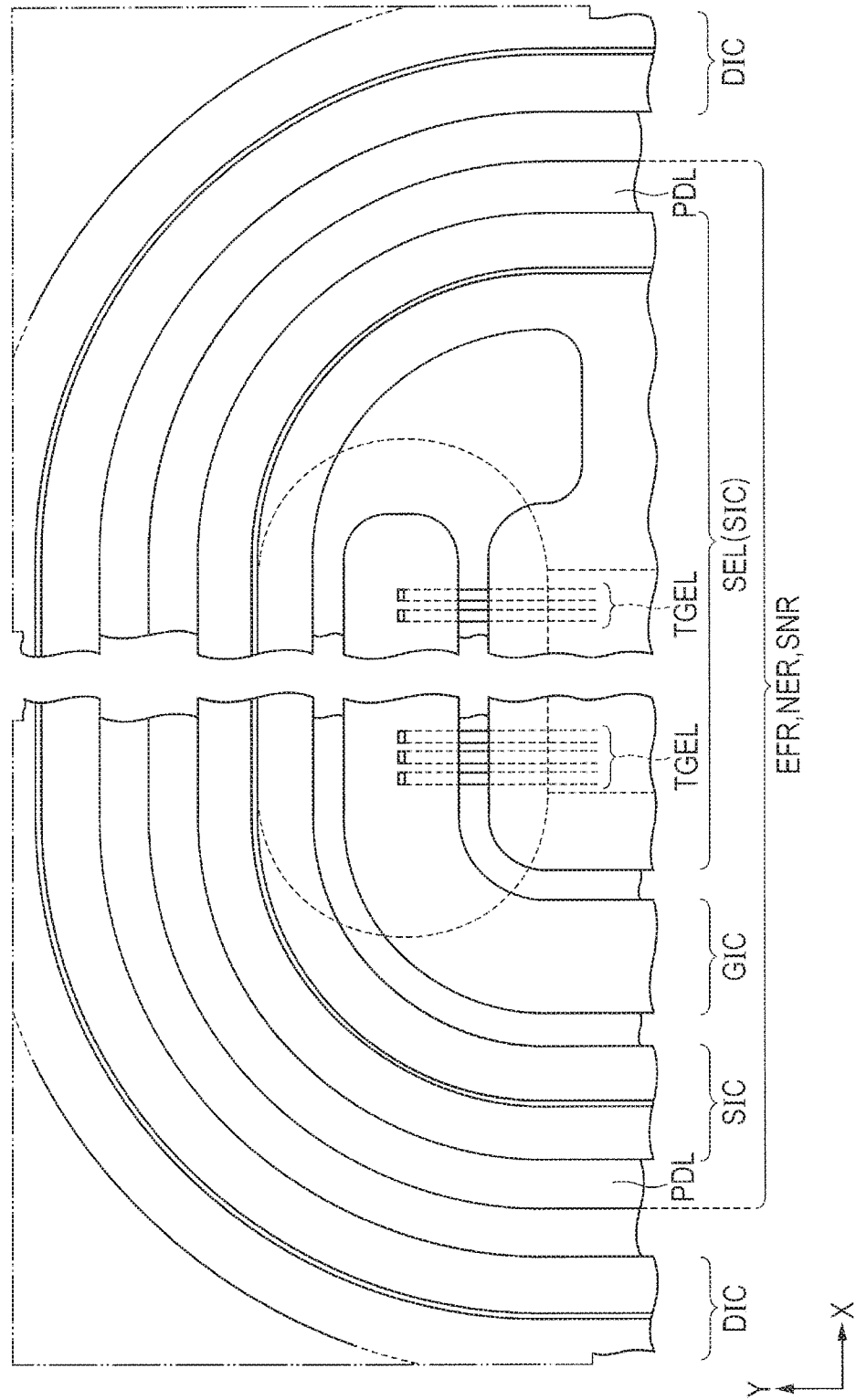
FIG. 29 is a first partial plan view collectively illustrating an example of a planar pattern within a frame A2 and an example of a planar pattern within a frame A3 shown in FIG. 28 in the fifth embodiment.
Figure 30:
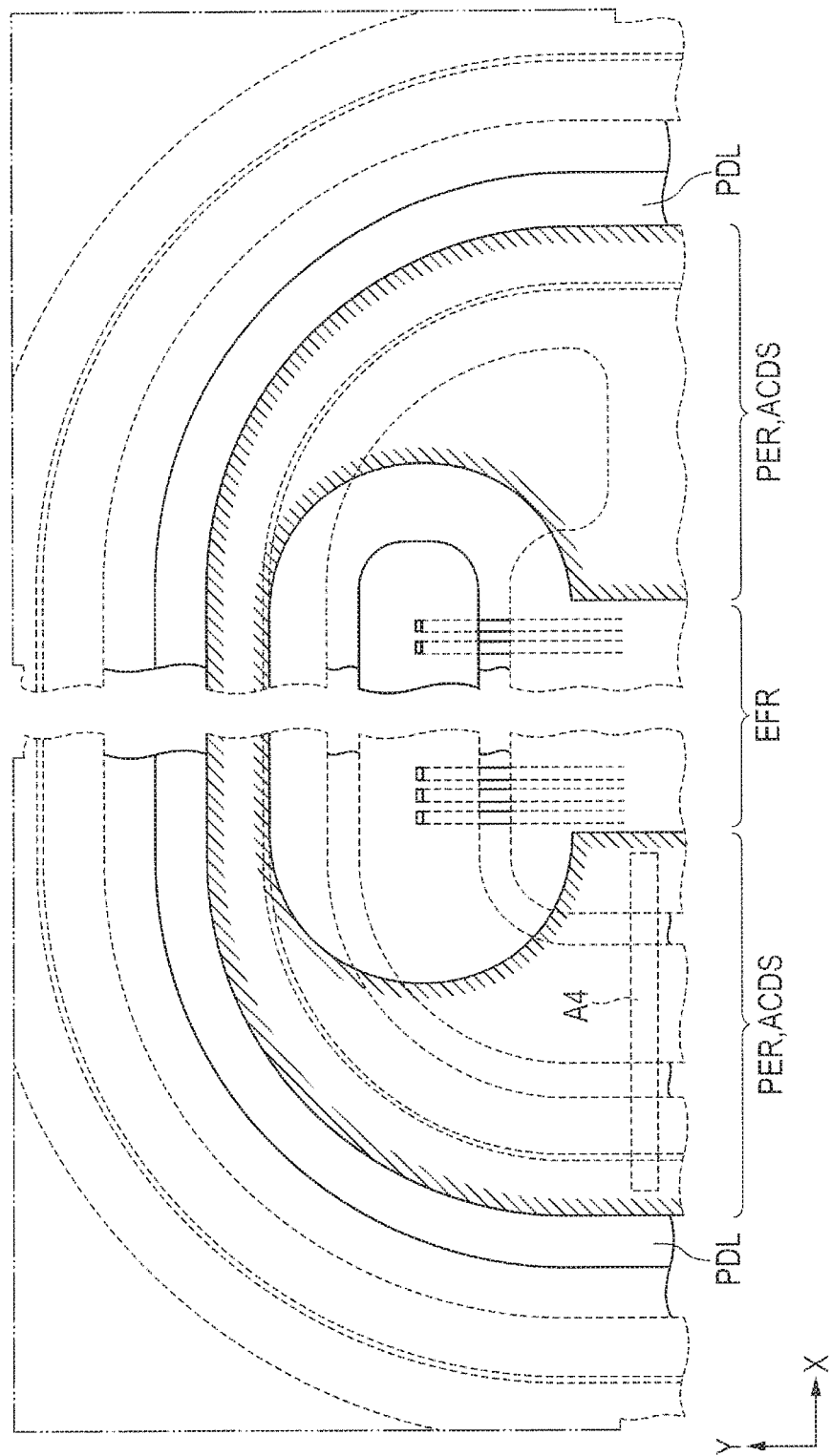
FIG. 30 is a second partial plan view collectively illustrating an example of a planar pattern within the frame A2 and an example of a planar pattern within a frame A3 shown in FIG. 28 in the fifth embodiment.
Figure 31:
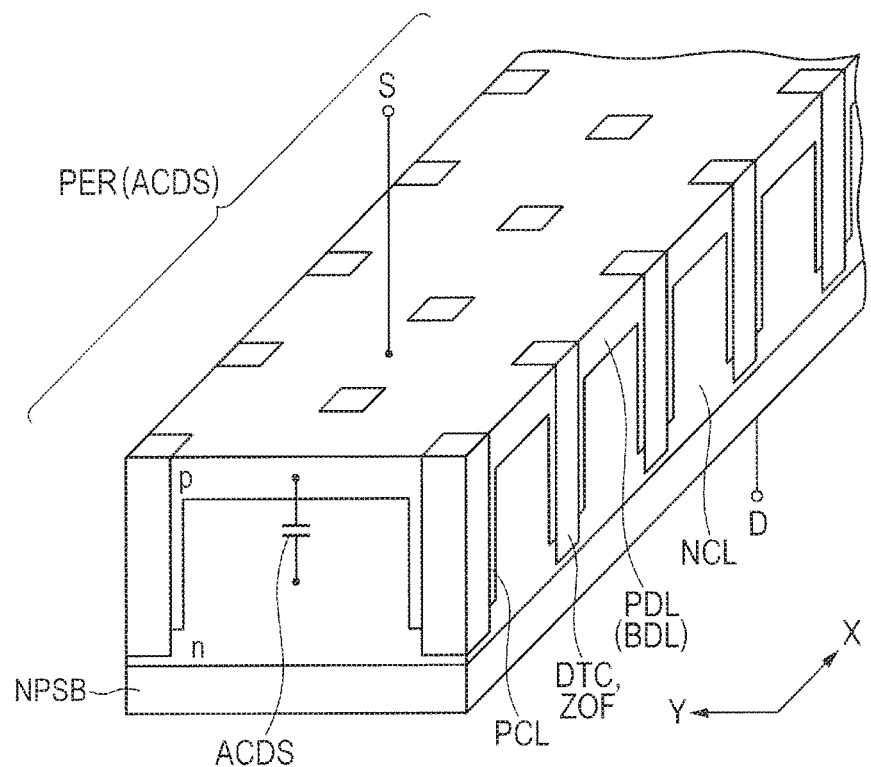
FIG. 31 is a perspective section view illustrating a structure within a frame A4 shown in FIG. 30 in the fifth embodiment.

Subsequently, a structure of the peripheral region and the like is described with reference to FIGS. 28, 29, 30, and 31. FIG. 28 illustrates an example of a planar pattern of the semiconductor device in a chip form. FIG. 29 illustrates arrangement of the source electrode and the like as structures within a circular frame A2 and within a circular frame A3 shown in FIG. 28. FIG. 30 illustrates an example of an arrangement pattern of the cell region and the peripheral region disposed below the source electrode and the like as structures within the circular frame A2 and within the circular frame A3. FIG. 31 illustrates an example of a perspective section view of a region within a dot line frame A4 shown in FIG. 30.

As shown in FIG. 29, the source electrode SEL, a gate interconnection GIC, a source interconnection SIC, and a drain electrode DIC are disposed at a corner portion of the semiconductor device. The source electrode SEL is electrically coupled to the source diffusion layer SDL and the base diffusion layer BDL (see FIG. 5). The source interconnection SIC is coupled to the source electrode SEL. The gate interconnection GIC is electrically coupled to the trench gate electrodes TGEL. The drain electrode DIC is electrically coupled to the $n^{++}$-type substrate NPSB (see FIG. 5) on a second main surface side of the semiconductor substrate.

As shown in FIG. 30, the cell region EFR is disposed below the source electrode SEL. Another capacitance ACDS is formed in a peripheral region PER between the cell region EFR and the circumferential end of the p-type diffusion layer PDL. The capacitance ACDS is formed within a hatched region. As shown in FIG. 31, the capacitance ACDS is formed by the p-type diffusion layer PDL and the n-type column layer NCL. The p-type diffusion layer PDL is electrically coupled to the source S. The n-type column layer NCL is electrically coupled to the drain D.

The buried insulators ZOF are formed from the first main surface toward the $n^{++}$-type substrate NPSB. The buried insulators ZOF are disposed in islands at an interval from each other. The p-type column layer PCL is formed so as to be in contact with the buried insulators ZOF and the n-type column layer NCL. Other structures of the cell region EFR and other structures of the gate pad region GPR are the same as those shown in FIGS. 3 to 5.

A method of manufacturing the semiconductor device of the fifth embodiment is now described. The semiconductor device of the fifth embodiment can be formed by the same manufacturing steps as the series of manufacturing steps of the semiconductor device described in the first embodiment except that a pattern of the trench gate electrode and a pattern of the buried insulating film are each changed. Specifically, in the step of forming the trench gate electrode (see FIG. 6), while the trench gate electrodes TGEL are formed in the cell region EFR and the snubber region NER, no trench gate electrode TGEL is formed in the peripheral region PER. In the step of forming the deep trenches (see FIG. 7), the deep trenches DTC are also formed in the peripheral region PER in addition to the cell region EFR.

In the semiconductor device of the fifth embodiment, specifically, the additional capacitance ACDS is formed in the peripheral region PER so as to be electrically coupled in parallel to the snubber part SNR. This increases the capacitance of the capacitance CDS2 of the snubber part SNR compared with a case of having no capacitance ACDS, and thus time for generating the voltage Vs2 can be set longer. As a result, time for self-turn-on of the insulated gate field effect transistor is lengthened, and thus the surge voltage can be securely reduced.

Sixth Embodiment

A sixth embodiment is described with a first example of a semiconductor device, in which the snubber region is defined in the peripheral region.

Figure 32:
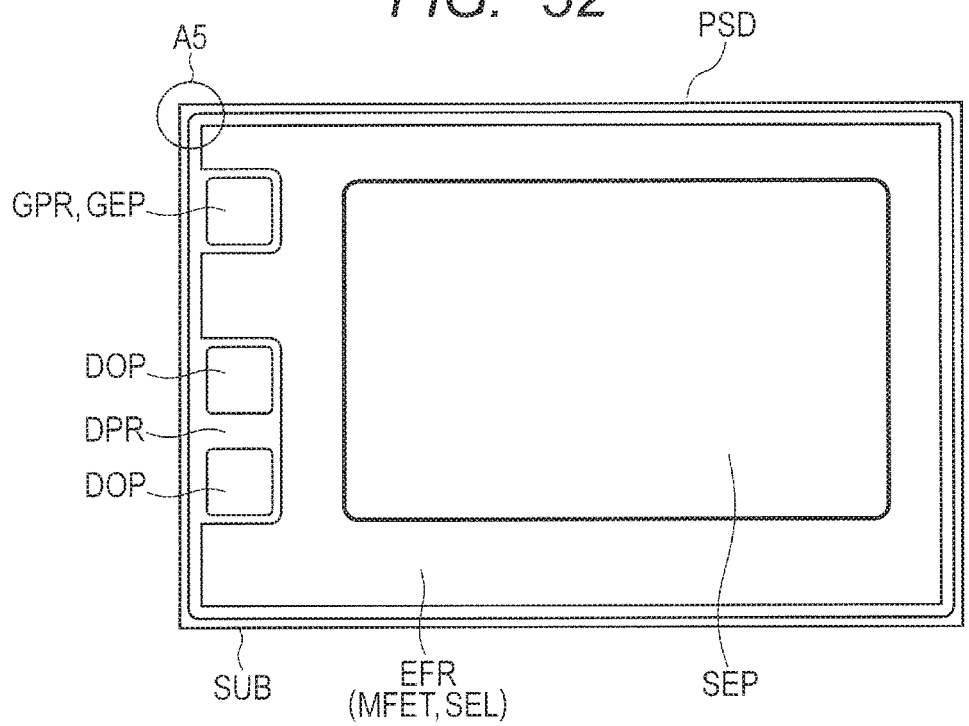
FIG. 32 is a plan view illustrating an example of a planar pattern of a semiconductor device in a chip form according to a sixth embodiment.
Figure 33:
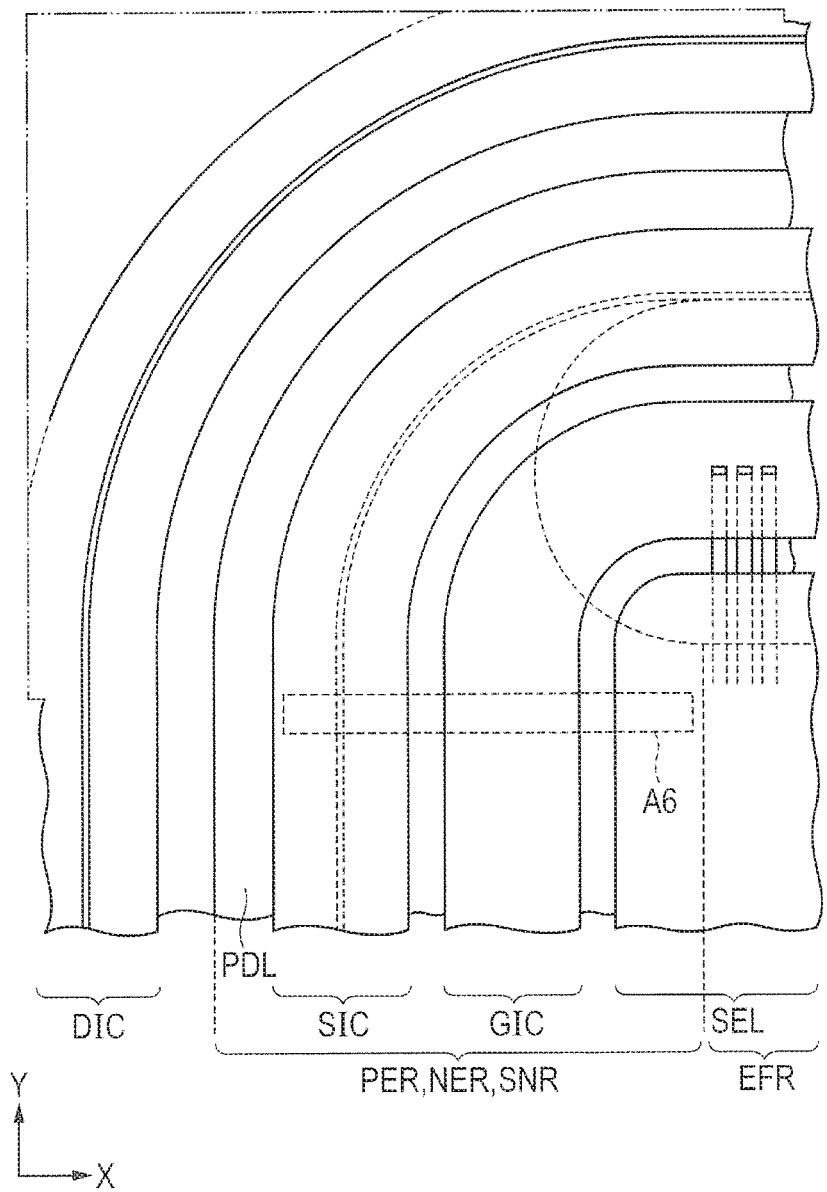
FIG. 33 is a partial plan view illustrating an example of a planar pattern within a frame A5 shown in FIG. 32 in the sixth embodiment.
Figure 34:
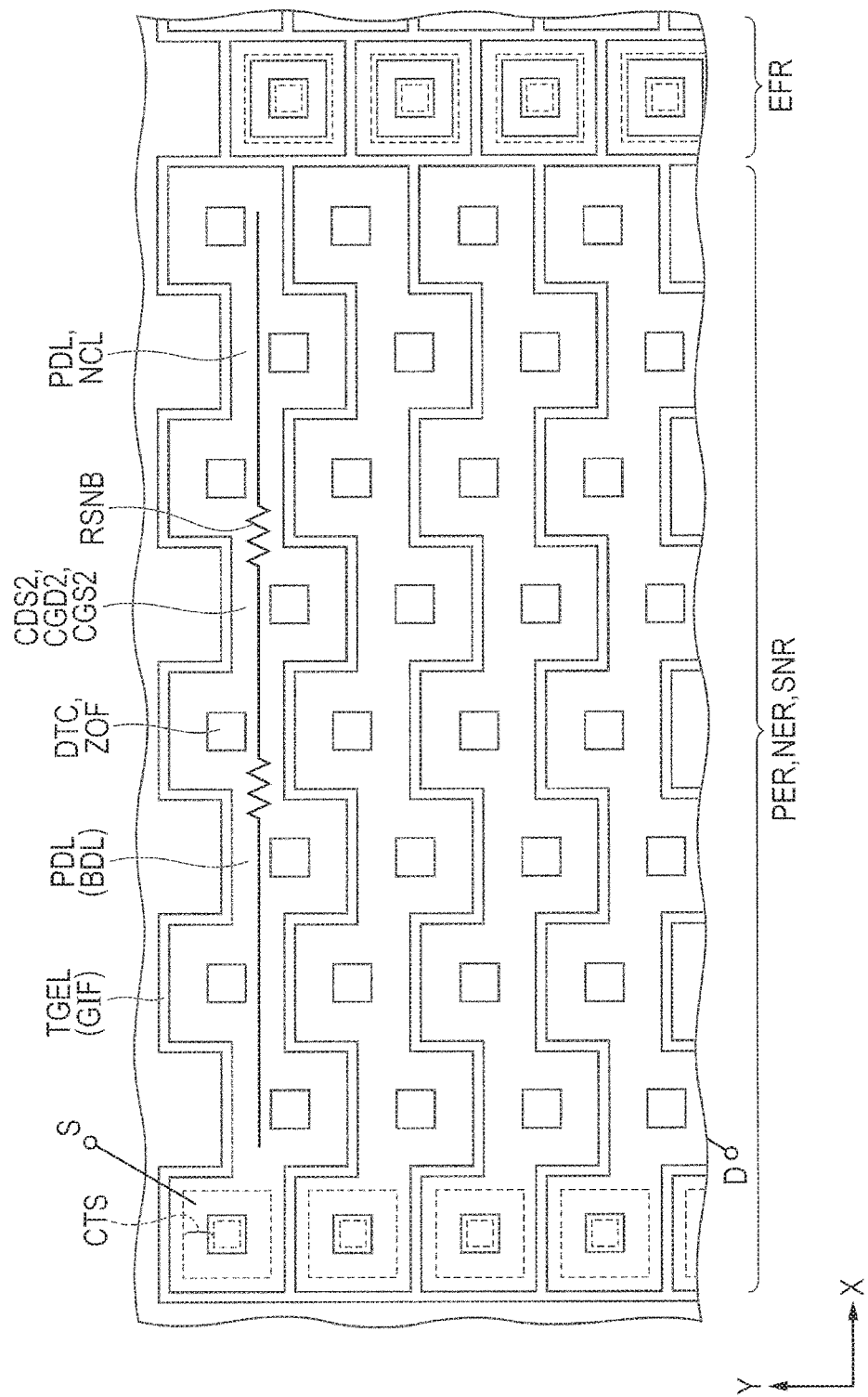
FIG. 34 is a partial plan view illustrating an example of a planar pattern within a frame A6 shown in FIG. 33 in the sixth embodiment.

A structure of the peripheral region is described with reference to FIGS. 32, 33, and 34. FIG. 32 illustrates an example of a planar pattern of the semiconductor device in a chip form. FIG. 33 illustrates an example of an arrangement pattern of the cell region EFR and the peripheral region PER disposed below the source electrode and the like as a structure within a circular frame A5 shown in FIG. 32. FIG. 34 illustrates an example of a planar pattern of the snubber part SNR within a dot line frame A6 shown in FIG. 33.

As shown in FIG. 33, the source electrode SEL, the gate interconnection GIC, the source interconnection SIC, and the drain electrode DIC are disposed at a corner portion of the semiconductor device. The source interconnection SIC is coupled to the source electrode SEL. The gate interconnection GIC is electrically coupled to the trench gate electrodes. The drain electrode DIC is electrically coupled to the nil-type substrate NPSB (see FIG. 5) on the second main surface side of the semiconductor substrate. The snubber part SNR is formed in the peripheral region PER.

The structure of the snubber part SNR is substantially the same as the structure of the snubber part SNR of the semiconductor device described in the first embodiment except that an arrangement pattern of the trench gate electrodes is somewhat different. As shown in FIG. 34, in the snubber region NER, the trench gate electrodes TGEL are disposed at an interval from each other in the Y-axis direction in a manner of extending in the X-axis direction while meandering and of tucking the respective contacts CTS.

The snubber part SNR is formed by the p-type diffusion layer PDL, the n-type column layer NCL, and the like. The p-type diffusion layer PDL is electrically coupled to the source S in a manner of being in contact with the source S at each contact CTS. The source interconnection SIC, which is located on a negative side of the X axis with respect to the cell region FER, is disposed alongside the source electrode SEL across the gate interconnection GIC. Hence, each contact CTS is disposed at an end portion on the negative side of the X axis. Since other configurations are similar to those of the semiconductor device shown in FIGS. 3, 4, and the like, the same components are designated by the same reference numeral, and duplicated description is omitted except when required.

In the semiconductor device of the sixth embodiment, as described in the first embodiment, the surge voltage, which is generated during recovery operation of the parasitic diode, can be absorbed as energy by the snubber part SNR. The insulated gate field effect transistor MFET can be self-turned on by the generated surge voltage to reduce the surge voltage. Furthermore, such a snubber part SNR can be formed in parallel with the step of forming the insulated gate field effect transistor without an additional step.

Seventh Embodiment

A seventh embodiment is described with a second example of the semiconductor device, in which the snubber region is defined in the peripheral region.

Figure 35:
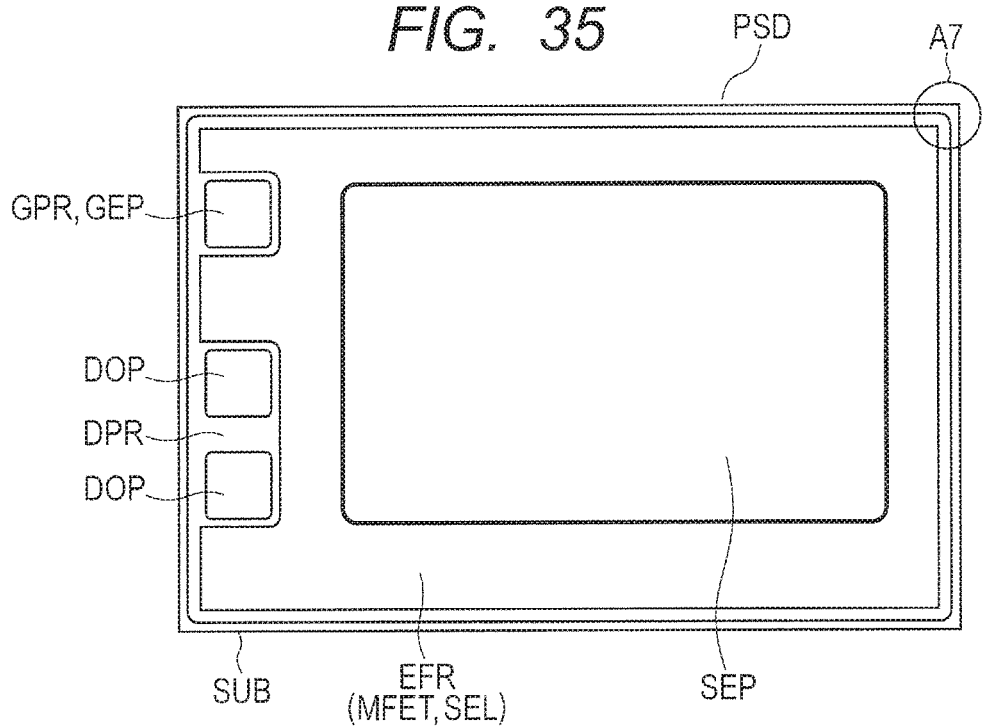
FIG. 35 is a plan view illustrating an example of a planar pattern of a semiconductor device in a chip form according to a seventh embodiment.
Figure 36:
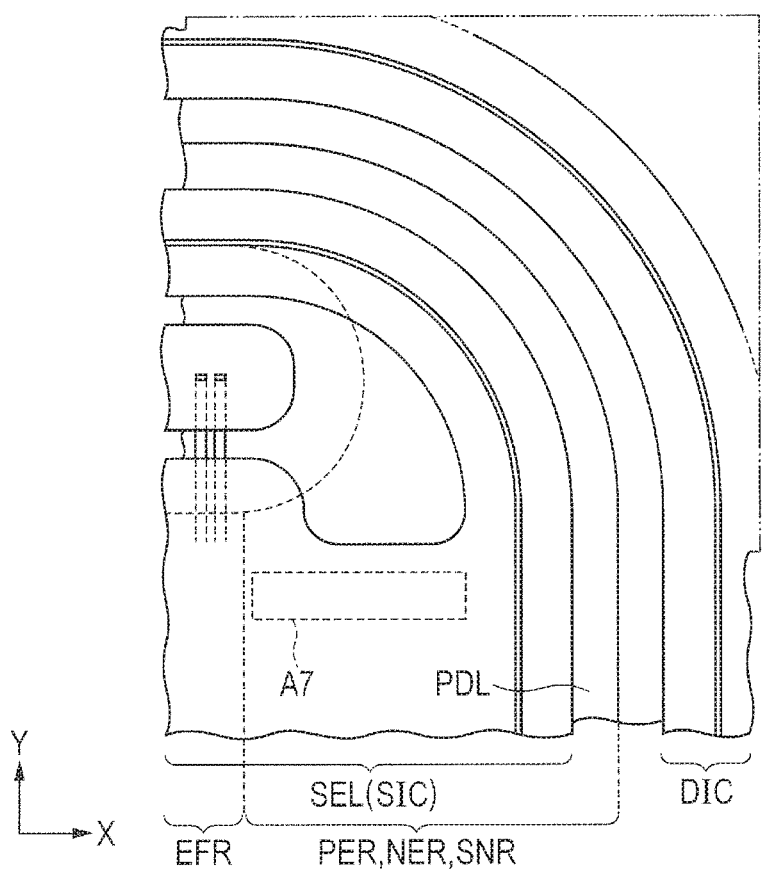
FIG. 36 is a partial plan view illustrating an example of a planar pattern within a frame A6 shown in FIG. 35 in the seventh embodiment.

A structure of the peripheral region is described with reference to FIGS. 35, 36, and 37. FIG. 35 illustrates an example of a planar pattern of the semiconductor device in a chip form. FIG. 36 illustrates an example of an arrangement pattern of the cell region EFR and the peripheral region PER disposed below the source electrode and the like as a structure within a circular frame A7 shown in FIG. 35. FIG. 37 illustrates an example of a planar pattern of the snubber part SNR within a dot line frame A7 shown in FIG. 35.

As shown in FIG. 36, the source electrode SEL, the gate interconnection GIC, the source interconnection SIC, and the drain electrode DIC are disposed at a corner portion of the semiconductor device. The source interconnection SIC is coupled to the source electrode SEL. The gate interconnection GIC is electrically coupled to the trench gate electrodes. The drain electrode DIC is electrically coupled to the nil-type substrate NPSB (see FIG. 5) on the second main surface side of the semiconductor substrate. The snubber part SNR is formed in the peripheral region PER.

The structure of the snubber part SNR is substantially the same as the structure of the snubber part SNR of the semiconductor device described in the first embodiment. As shown in FIG. 37, in the snubber region NER, the trench gate electrodes TGEL are disposed at an interval from each other in the X-axis direction in a manner of extending in the Y-axis direction and tucking the respective contacts CTS.

The snubber part SNR is formed by the p-type diffusion layer PDL, the n-type column layer NCL, and the like. The p-type diffusion layer PDL is electrically coupled to the source S in a manner of being in contact with the source S at each contact CTS. The source interconnection SIC, which is located on a normal direction side of the X axis with respect to the cell region FER, is directly coupled to the source electrode SEL. The contact CTS is disposed at an end portion on the positive side of the Y axis, for example. Since other configurations are similar to those of the semiconductor device shown in FIGS. 3, 4, and the like, the same components are designated by the same reference numeral, and duplicated description is omitted except when required.

In the semiconductor device of the sixth embodiment, as described in the first embodiment, the surge voltage, which is generated during recovery operation of the parasitic diode, can be absorbed as energy by the snubber part SNR. The insulated gate field effect transistor MFET can be self-turned on by the generated surge voltage to reduce the surge voltage.

Specifically, the p-type diffusion layer PDL and the n-type column layer NCL extend in the Y-axis direction. This increases allowance of adjustment of length of the p-type diffusion layer PDL or the like compared with a case where the p-type diffusion layer PDL and the like extend in the X-axis direction (see FIGS. 33 and 34). As a result, an optimum snubber part SNR can be formed in accordance with use of the semiconductor device. In addition, such a snubber part SNR can be formed in parallel with the step of forming the insulated gate field effect transistor without an additional step.

The respective embodiments have been described with an exemplary case where the snubber region NER is disposed in a region other than the cell region EFR in which the insulated gate field effect transistor MFET is formed. The snubber region NER however is not limitedly disposed in such a region. For example, part of the cell region FER may be originally used to dispose the snubber region NER to form the snubber part instead of forming the insulated gate field effect transistor. In this way, an optimum snubber part in accordance with use of the semiconductor device can be provided to securely reduce the surge voltage.

The snubber parts and the like of the semiconductor device described in the respective embodiments can be variously combined as necessary.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

The above-described embodiments include the following aspects.

Supplementary Note 1

A method of manufacturing a semiconductor device, the method includes the steps of:

providing a semiconductor substrate having a first main surface and a second main surface opposed to each other, and having a basal substrate of a first conductivity type on a side close to the second main surface;

defining a first region and defining a second region in a region other than the first region on aside close to the first main surface of the semiconductor substrate; and forming an element through a step including formation of an insulated gate field effect transistor in the first region, and formation of a snubber part having a resistance and a capacitance in the second region;

where the step of forming the element includes the steps of:

forming a first diffusion layer of the first conductivity type so as to extend from the first main surface of the semiconductor substrate to a first depth while being electrically coupled to the basal substrate;

forming a second diffusion layer of a second conductivity type from the first main surface of the semiconductor substrate to a second depth shallower than the first depth so as to be a channel of the insulated gate field effect transistor in the first region, and to be the resistance of the snubber part while being contacted to the first diffusion layer to be the capacitance in the second region; and forming a source electrode so as to be electrically coupled to the source of the insulated gate field effect transistor in the first region and electrically coupled to the second diffusion layer in the second region, where in the step of forming the element, the element is formed such that the second diffusion layer extends in a first direction from a contact at which the second diffusion layer is electrically coupled to the source electrode.

Supplementary Note 2

The method according to supplementary note 1, where the step of forming the element includes a step of forming a gate pad to be electrically coupled to the gate of the insulated gate field effect transistor, and the step of defining the second region includes a step of defining the second region in a region in which the gate pad is disposed.

Supplementary Note 3

The method according to supplementary note 1, where the step of forming the element includes the steps of:

forming a temperature detecting element that detects temperature; and forming a temperature detecting pad to be electrically coupled to the temperature detecting element, where the step of defining the second region includes a step of defining the second region in a region in which the temperature detecting pad is disposed.

Supplementary Note 4

The method according to supplementary note 1, where the step of forming the element includes a step of forming trench gate electrodes that extend from the first main surface of the semiconductor substrate to the second depth, and the step of forming the trench gate electrodes includes a step of forming the trench gate electrodes at an interval from each other in a second direction intersecting the first direction in a manner of dividing the first region from the second region, and extending in the first direction from the contacts while tucking the respective contacts in the second region.

Supplementary Note 5

The method according to supplementary note 1, where the step of forming the element includes a step of forming first buried insulators from the first main surface of the semiconductor substrate toward the basal substrate.

Supplementary Note 6

The method according to supplementary note 5, where the step of forming the first buried insulators includes a step of forming the first buried insulators in islands at an interval from each other in the first direction from the contacts in the second region.

Supplementary Note 7

The method according to supplementary note 5, where the step of forming the first buried insulators includes a step of forming the first buried insulators such that in the second region, the first buried insulators are formed in stripes at an interval from each other in a second direction intersecting the first direction while extending in the first direction from the contacts.

Supplementary Note 8

The method according to supplementary note 5, where the step of forming the first buried insulators includes a step of forming the first buried insulators in the first region while no first buried insulator is formed in the second region.

Supplementary Note 9

The method according to supplementary note 1, where the step of forming the element includes the step of forming a third diffusion layer of the first conductivity type from the first main surface of the semiconductor substrate to a third depth shallower than the second depth, and in the step of forming the third diffusion layer, the third diffusion layer is formed in the second diffusion layer in a manner of excluding portions, in which the contacts are disposed, in the second region.

Supplementary Note 10

The method according to supplementary note 1, where the step of forming the second diffusion layer includes a step of forming the second diffusion layer such that a circumferential end of the second diffusion layer is located along a circumference of the semiconductor substrate at a position inwardly distant from the circumference, and the step of defining the first region and the second region includes the steps of:

defining the first region within a region in which the second diffusion layer is formed, and defining a peripheral region in a region located between the circumferential end of the second diffusion layer and the first region, and the step of forming the element includes the steps of:

forming another capacitance, which is electrically coupled in parallel to the snubber part, by the first diffusion layer and the second diffusion layer located in the peripheral region; and forming second buried insulators in the peripheral region so as to extend from a side close to the first main surface of the semiconductor substrate toward the basal substrate.

Supplementary Note 11

The method according to supplementary note 1, where the step of forming the second diffusion layer includes a step of forming the second diffusion layer such that a circumferential end of the second diffusion layer is located along a circumference of the semiconductor substrate at a position inwardly distant from the circumference, the step of defining the first region and the second region includes the steps of:

defining the first region within a region in which the second diffusion layer is formed; and defining the second region in a peripheral region located between the circumferential end of the second diffusion layer and the first region.

Supplementary Note 12

The method according to supplementary note 11, where the step of forming the element includes the step of forming trench gate electrodes extending from the first main surface of the semiconductor substrate to the second depth, and the step of forming the trench gate electrodes includes a step of forming the trench gate electrodes in a direction as the first direction intersecting a direction, in which the circumferential end of the second diffusion layer extends, in the second region.

Supplementary Note 13

The method according to supplementary note 11, where the step of forming the element includes the step of forming trench gate electrodes extending from the first main surface of the semiconductor substrate to the second depth, and the step of forming the trench gate electrodes includes a step of forming the trench gate electrodes in a direction, as the first direction, intersecting a direction in which the circumferential end of the second diffusion layer extends, in the second region.

What is claimed is:

1. A semiconductor device comprising:
   a semiconductor substrate having a first main surface and a second main surface opposed to each other;
   a first region defined on a side close to the first main surface of the semiconductor substrate;
   a second region defined in a region other than the first region on the side close to the first main surface of the semiconductor substrate;
   a first diffusion layer of a first conductivity type and a second diffusion layer of a second conductivity type that are in contact with each other and formed from the first main surface of the semiconductor substrate toward the second main surface;
   a third diffusion layer of the first conductivity type is formed from the first main surface of the semiconductor substrate to a depth shallower than a bottom of the second diffusion layer;
   an insulated gate field effect transistor that is formed in the first region, and allows current conduction between the first main surface and the second main surface; and
   a snubber part that is formed in the second region while having a resistance and a capacitance, and is electrically coupled in parallel to the insulated gate field effect transistor,
   wherein the first diffusion layer is located on a side close to the second main surface, and the second diffusion layer is located on the side close to the first main surface,
   wherein in the second region,
      the first diffusion layer and the second diffusion layer are provided as the capacitance while the first diffusion layer is electrically coupled to a drain of the insulated gate field effect transistor,
      the second diffusion layer is electrically coupled as the resistance to a source of the insulated gate field effect transistor, and
      the second diffusion layer is formed so as to extend in a first direction from contacts at which the second diffusion layer is electrically coupled to the source.

2. The semiconductor device according to claim 1, further comprising:
   a gate pad region defined on the side close to the first main surface of the semiconductor substrate; and
   a gate pad formed in the gate pad region, and electrically coupled to a gate electrode of the insulated gate field effect transistor,
   wherein the second region includes a portion defined in the gate pad region, and
   wherein the snubber part is formed below the gate pad.

3. The semiconductor device according to claim 1, further comprising:
   a temperature detecting element region defined on the side close to the first main surface of the semiconductor substrate, and having a temperature detecting element disposed in the temperature detecting element region to detect temperature; and
   a temperature detecting element pad formed in the temperature detecting element region, and electrically coupled to the temperature detecting element,
   wherein the second region includes a portion defined in the temperature detecting element region, and
   wherein the snubber part is formed below the temperature detecting element pad.

4. The semiconductor device according to claim 1,
   wherein trench gate electrodes are formed so as to extend from the first main surface of the semiconductor substrate to the first diffusion layer,
   wherein the trench gate electrodes divide the first region from the second region, and
   wherein in the second region, the trench gate electrodes extend in the first direction from portions at which the contacts are located, and are arranged at an interval from each other in a second direction intersecting the first direction in a manner of tucking the respective contacts.

5. The semiconductor device according to claim 1,
   wherein in the second region, the third diffusion layer is formed in a manner of excluding the portions in which the contacts are disposed.

6. The semiconductor device according to claim 1,
   wherein the second diffusion layer is formed such that a circumferential end of the second diffusion layer is located along a circumference of the semiconductor substrate at a position inwardly distant from the circumference,
   wherein the first region is defined within a region in which the second diffusion layer is formed,
   wherein in the first region, the second diffusion layer becomes a channel of the insulated gate field effect transistor, and
   wherein in a peripheral region located between the circumferential end of the second diffusion layer and the first region,
   another capacitance is formed by the first diffusion layer and the second diffusion layer located in the peripheral region so as to be electrically coupled in parallel to the snubber part, and
   second buried insulators are formed from the side close to the first main surface toward the second main surface.

7. The semiconductor device according to claim 1, wherein in the first region and the second region, first buried insulators are formed at least in the first region from the side close to the first main surface toward the second main surface.

8. The semiconductor device according to claim 7,
   wherein the first buried insulators are formed in the second region, and
   wherein the first buried insulators are disposed in islands at an interval from each other in the first direction.

9. The semiconductor device according to claim 7,
   wherein the first buried insulators are formed in the second region, and wherein the first buried insulators extend in the first direction from the portions at which the contacts are located, and are disposed in stripes at an interval from each other in a second direction intersecting the first direction.

10. The semiconductor device according to claim 7, wherein the first buried insulators are formed in the first region, and no first buried insulator is formed in the second region.

11. The semiconductor device according to claim 1, wherein the second diffusion layer is formed such that a circumferential end of the second diffusion layer is located along a circumference of the semiconductor substrate at a position inwardly distant from the circumference,
wherein the first region is defined within a region in which the second diffusion layer is formed, and
wherein the second region is defined in a peripheral region located between the circumferential end of the second diffusion layer and the first region.

12. The semiconductor device according to claim 11, wherein in the second region, trench gate electrodes are formed so as to extend from the first main surface of the semiconductor substrate to the first diffusion layer, and
wherein in the second region disposed in the peripheral region, the trench gate electrodes extend in a direction as the first direction intersecting a direction in which the circumferential end of the second diffusion layer extends.

13. The semiconductor device according to claim 11, wherein in the second region, trench gate electrodes are formed so as to extend from the first main surface of the semiconductor substrate to the first diffusion layer, and
wherein in the second region disposed in the peripheral region, the trench gate electrodes extend in a direction as the first direction in which the circumferential end of the second diffusion layer extends.

14. A method of manufacturing a semiconductor device, the method comprising the steps of:
providing a semiconductor substrate having a first main surface and a second main surface opposed to each other;
defining a first region and defining a second region in a region other than the first region on a side close to the first main surface of the semiconductor substrate; and
forming an element through a step including formation of an insulated gate field effect transistor in the first region, and formation of a snubber part having a resistance and a capacitance in the second region,
wherein the step of forming the element includes the steps of:
forming a first diffusion layer of a first conductivity type so as to extend from the first main surface of the semiconductor substrate to a first depth;
forming a second diffusion layer of a second conductivity type from the first main surface of the semiconductor substrate to a second depth shallower than the first depth so as to be a channel of the insulated gate field effect transistor in the first region, and to be the resistance of the snubber part while being in contact with the first diffusion layer to be the capacitance in the second region;
forming a third diffusion layer of the first conductivity type from the first main surface of the semiconductor substrate to a third depth shallower than the second depth in the first region; and
forming a source electrode so as to be electrically coupled to a source of the insulated gate field effect transistor in the first region and electrically coupled to the second diffusion layer in the second region,
wherein the step of forming the element includes a step of forming the element such that the second diffusion layer extends in a first direction from a contact at which the second diffusion layer is electrically coupled to the source electrode.

15. The method according to claim 14, wherein the step of forming the element includes a step of forming a gate pad electrically coupled to a gate of the insulated gate field effect transistor, and
wherein the step of defining the second region includes a step of defining the second region in a region in which the gate pad is disposed.

16. The method according to claim 14, wherein the step of forming the element includes a step of forming trench gate electrodes that extend from the first main surface of the semiconductor substrate to the second depth, and
wherein the step of forming the trench gate electrodes includes a step of forming the trench gate electrodes at an interval from each other in a second direction intersecting the first direction in a manner of dividing the first region from the second region, and extending in the first direction from the contacts while tucking the respective contacts in the second region.

17. The method according to claim 14, wherein the step of forming the element includes a step of forming first buried insulators from the first main surface of the semiconductor substrate toward the second main surface.

18. The method according to claim 14, wherein in the step of forming the third diffusion layer, in the second region, the third diffusion layer is formed in the second diffusion layer in a manner of excluding the portion in which the contact is disposed.

19. The method according to claim 14, wherein the step of forming the second diffusion layer includes a step of forming the second diffusion layer such that a circumferential end of the second diffusion layer is located along a circumference of the semiconductor substrate at a position inwardly distant from the circumference, and
wherein the step of defining the first region and the second region includes the steps of:
defining the first region within a region in which the second diffusion layer is formed; and
defining the second region in a peripheral region located between the circumferential end of the second diffusion layer and the first region.

20. A semiconductor device comprising:
a semiconductor substrate having a first main surface and a second main surface opposed to each other;
a first region defined on a side close to the first main surface of the semiconductor substrate;
a second region defined in a region other than the first region on the side close to the first main surface of the semiconductor substrate;
a first diffusion layer of a first conductivity type and a second diffusion layer of a second conductivity type that are in contact with each other and formed from the first main surface of the semiconductor substrate toward the second main surface;

a third diffusion layer of the first conductivity type is formed from the first main surface of the semiconductor substrate to a depth shallower than a bottom of the second diffusion layer;

an insulated gate field effect transistor that is formed in the first region, and allows current conduction between the first main surface and the second main surface; and a snubber part that is formed in the second region while having a resistance and a capacitance, and is electrically coupled in parallel to the insulated gate field effect transistor, wherein the first diffusion layer is located on a side close to the second main surface, and the second diffusion layer is located on the side close to the first main surface, wherein in the second region, the first diffusion layer and the second diffusion layer are provided as the capacitance while the first diffusion layer is electrically coupled to a drain of the insulated gate field effect transistor, the second diffusion layer is electrically coupled as the resistance to a source of the insulated gate field effect transistor, the second diffusion layer is formed so as to extend in a first direction from contacts at which the second diffusion layer is electrically coupled to the source, and the third diffusion layer is not disposed at portions in which the contacts are disposed.

* * * * *